United States Patent
Sakimura et al.

(10) Patent No.: US 8,510,633 B2
(45) Date of Patent: *Aug. 13, 2013

(54) SEMICONDUCTOR STORAGE DEVICE AND METHOD OF OPERATING THE SAME

(75) Inventors: Noboru Sakimura, Tokyo (JP); Tadahiko Sugibayashi, Tokyo (JP); Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 581 days.

This patent is subject to a terminal disclaimer.

(21) Appl. No.: 12/596,243

(22) PCT Filed: Apr. 14, 2008

(86) PCT No.: PCT/JP2008/057285
§ 371 (c)(1),
(2), (4) Date: Feb. 9, 2010

(87) PCT Pub. No.: WO2008/133087
PCT Pub. Date: Nov. 6, 2008

(65) Prior Publication Data
US 2011/0016371 A1    Jan. 20, 2011

(30) Foreign Application Priority Data

Apr. 17, 2007 (JP) .................. 2007-108569

(51) Int. Cl.
*G11C 29/00* (2006.01)
(52) U.S. Cl.
USPC ............ 714/765; 714/763; 714/766; 365/200

(58) Field of Classification Search
USPC ................ 714/710, 711, 718–723, 763–766; 365/200–201
See application file for complete search history.

(56) References Cited

U.S. PATENT DOCUMENTS

| | | | |
|---|---|---|---|
| 5,056,095 A * | 10/1991 | Horiguchi et al. ............ 714/765 |
| 5,758,050 A * | 5/1998 | Brady et al. ................ 714/1 |
| 6,055,178 A | 4/2000 | Naji | |
| 6,545,906 B1 | 4/2003 | Savtchenko et al. | |
| 6,584,589 B1 * | 6/2003 | Perner et al. ................ 714/721 |

(Continued)

FOREIGN PATENT DOCUMENTS

| JP | 2003068096 A | 3/2003 |
| JP | 2003115195 A | 4/2003 |

(Continued)

OTHER PUBLICATIONS

International Search Report for PCT/JP2008/057285 mailed Jul. 22, 2008.

*Primary Examiner* — Steve Nguyen

(57) ABSTRACT

Provided is an operation method which can be applied to a PRAM, an ReRAM, and a solid electrolyte memory which stores error correction codes, each of which comprises of symbols, each of which comprises bits, and which codes allow error correction in units of symbols. In the operation method, the respective symbols are read by using different reference cells 12. When a correctable error is detected in read data from data cells forming the error correction codes and corresponding to an input address, a data in a data cell corresponding to the error bit is corrected for a first error symbol of an one bit error pattern, and data in a reference cell that is used to read the second error symbol are corrected for a second error symbol related to a multi-bit error pattern.

18 Claims, 16 Drawing Sheets

(56) References Cited

U.S. PATENT DOCUMENTS

| | | |
|---|---|---|
| 6,760,251 B2 | 7/2004 | Hidaka |
| 6,885,579 B2 | 4/2005 | Sakimura et al. |
| 6,898,113 B2 | 5/2005 | Tsuji |
| 7,149,948 B2 | 12/2006 | Davis et al. |
| 7,286,429 B1 | 10/2007 | Liaw et al. |
| 7,499,314 B2 * | 3/2009 | Yang et al. .................. 365/158 |
| 7,733,729 B2 * | 6/2010 | Boeve ........................ 365/210.1 |
| 7,747,926 B2 * | 6/2010 | Wise et al. .................... 714/763 |
| 7,770,079 B2 * | 8/2010 | Radke et al. ................. 714/718 |
| 7,865,797 B2 * | 1/2011 | Eguchi et al. ................ 714/752 |
| 2003/0023924 A1 | 1/2003 | Davis et al. |
| 2003/0023925 A1 | 1/2003 | Davis et al. |
| 2003/0172339 A1 | 9/2003 | Davis et al. |
| 2005/0030799 A1 * | 2/2005 | Smith et al. .................... 365/199 |
| 2005/0055621 A1 | 3/2005 | Adelmann et al. |
| 2007/0260962 A1 | 11/2007 | Wise et al. |
| 2009/0141544 A1 | 6/2009 | Sakimura et al. |
| 2011/0016371 A1 | 1/2011 | Sakimura et al. |

FOREIGN PATENT DOCUMENTS

| | | |
|---|---|---|
| JP | 2003115197 A | 4/2003 |
| JP | 2005056556 A | 3/2005 |
| JP | 2005085464 A | 3/2005 |
| JP | 2006286047 A | 10/2006 |
| WO | 2007046349 A | 4/2007 |
| WO | 2007046350 A | 4/2007 |

* cited by examiner

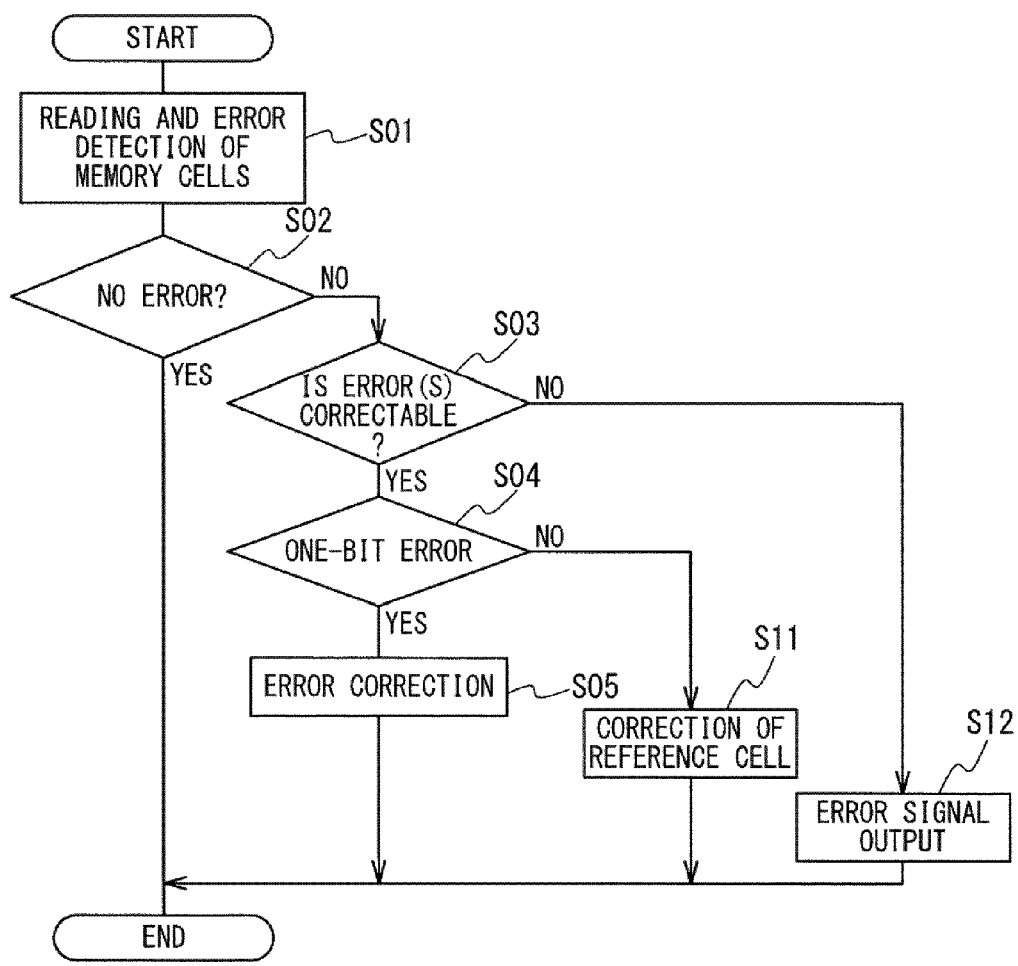

SEMICONDUCTOR STORAGE DEVICE AND METHOD OF OPERATING THE SAME

TECHNICAL FIELD

The present invention relates to a phase change random access memory (PRAM), a resistance change random access memory (ReRAM) and a nonvolatile semiconductor storage device such as a solid electrolyte memory, in particular, a data error correcting technique in the nonvolatile semiconductor storage device which performs reading using a reference cell.

BACKGROUND ART

In recent years, a new nonvolatile semiconductor storage device which stores information of one bit therein by changing a resistance of the memory has been actively researched and developed. The PRAM (Phase change RAM) using a phase change resistance element made of chalcogenide alloy or the like as a memory element is an example of such nonvolatile semiconductor storage device. PRAM utilizes a property that a resistance value of the phase change resistance element changes depending on a heating method (or a cooling method after heating). Most typically, the phase change resistance element is heated by passing a current through the phase change resistance element to generate Joule heat. Another example is the ReRAM (Resistive RAM) using a metal oxide resistance element made of perovskite oxide or the like as the memory element. ReRAM utilizes a property that a resistance value of the metal oxide resistance element made of perovskite oxide or the like changed depending on a voltage or a current applied to the metal oxide resistance element. A solid electrolyte memory using solid electrolyte resistance element made of solid electrolyte such as copper sulfide as the memory element has been researched and developed. The solid electrolyte resistance element is an element utilizing transfer of atoms in the solid electrolyte and a resistance value of the solid electrolyte resistance element changes depending on a polarity of the applied voltage. The solid electrolyte memory utilizes such property of the solid electrolyte resistance element.

Read operations of data stored in these memory elements are commonly performed by detecting the resistance value. One of typical methods of detecting the resistance value is a method of providing a reference cell in which prescribed data is previously programmed in a memory cell and comparing a signal (typically current signal) obtained from the memory cell in a selected state with a signal obtained from the reference cell. For example, the reference cell in which data "0" is programmed and the reference cell in which data "1" is programmed are prepared and an average current value of currents passing through these reference cells is compared to a current value of a current passing through the memory cell to perform the read operation.

Like other many memory devices, the above-mentioned the PRAM, the ReRAM and the solid electrolyte memory inevitably encounter data error in the memory cell. In the case of the PRAM, since data is written based on variation in the heating methods, the PRAM is susceptible to an operating environment, in particular, an environmental temperature. For example, when the PRAM optimized at room temperature is operated in an environment of about 100° C., the memory cell which normally operates at room temperature can defectively operate. Furthermore, since a write operation and the read operation use a same current path, the stored data can be rewritten by the read operation. On the other hand, in the case of the ReRAM and the solid electrolyte memory, control of the write operation is complicated, for example, the write operation needs to be changed depending on data to be written, and the write operation may not be normally performed due to power voltage variation. Like the PRAM, since the write operation and the read operation use the same current path, the stored data can be rewritten by the read operation. As described above, in the PRAM, the ReRAM and the solid electrolyte memory, it is hard to prevent a soft error caused by using the same current path in the write operation and the read operation, resulting in that undesired inversion of the stored data inevitably occurs at a low probability.

To address such data error, as in the other many memory devices, it is desired that the soft error is relieved according to an ECC (Error check and correction) technique using an error correction code. However, in the case of the soft error caused by rewriting of the stored data in the read operation, thought should be given to a fact that it is unclear whether the data cell or the reference cell should be corrected. The reference cell is accessed in the read operation at all times and may be undesirably inverted at a low probability. Accordingly, even if the data error is detected, when the data stored in the data cell is merely corrected, the soft error possibly cannot be relieved in the end.

In addition, in an error correction in the PRAM, the ReRAM and the solid electrolyte memory, desirably, at an error detection, it can be predicted or decided which of the data cell or the reference cell has the soft error at a high probability. Furthermore, it is desired that even when the data error exists in the reference cells, the error correction can be performed. The data error in the reference cell tends to appear as a burst error. However, when the burst error due to the data error in the reference cell affects a too wide range, the error correction cannot be performed.

From one aspect of the error correcting method, it can be considered that both the data cell with error and the reference cell used for reading of the data cell are unconditionally corrected at the error detection. However, simultaneously performing the write operation in the data cell and the reference cell leads to complication of an address decoder and requires a dedicated writing circuit for the reference cell. Generally, a voltage or a current necessary for the write operation of the PRAM, the ReRAM and the solid electrolyte memory is not small and an area of the writing circuit is large. In addition, the write operation in the memory cell which does not require an error correction is performed, which is inefficient. Therefore, such error correcting method leads to an increase in the circuit area and power consumption.

Against this backdrop, there is demand for a technique capable of performing the error correction without overhead of the circuit area and power consumption even if the data error occurs in any of the data cell and the reference cell.

DISCLOSURE OF INVENTION

An object of the present invention is to provide a technique capable of performing the error correction without overhead of a circuit area and power consumption even if a data error occurs in any of the data cells and the reference cell in the PRAM, the ReRAM and the solid electrolyte memory.

In an aspect of the present invention, provided is an operation method, of a semiconductor storage device which stores in a memory array, error correction codes, each of which comprises of symbols, each of which comprises bits, and which codes allow error correction in units of symbols. Said plurality of bits are stored in memory cells including any of phase change resistance elements, metal oxide resistance elements and solid electrolyte resistance elements. In this operation method, the respective symbols are read by using different reference cells. Furthermore, in this operation method, when a correctable error is detected in read data from data cells forming said error correction codes and corresponding to an input address, (A) for a first error symbol of an one bit error pattern, a data in a data cell corresponding to the error bit is corrected, and (B) for a second error symbol related to a multi-bit error pattern, a data in a reference cell that is used to read the second error symbol is corrected.

In another aspect of the present invention, provided is an operation method of a semiconductor storage device including a plurality of data cells for storing error correction codes, each of which comprises of symbols, each of which comprises bits, and which codes allow error correction in units of symbols, a plurality of reference cells used for reading from said data cells, and a peripheral circuit comprising an ECC circuit. Each of said plurality of data cells and said plurality of reference cells includes any of a phase change resistance element, a metal oxide resistance element and a solid electrolyte resistance element. In this operation method, the respective symbols are read by using different reference cells. When a correctable error is detected in read data from data cells, for a first error symbol of a one-bit error pattern, said peripheral circuit performs a correcting operation which involves comparing respective bits of the read data with corresponding bits of decoded data outputted by the ECC circuit and writing a right data into a data cell corresponding to a non-matching bit, that is, an error bit, and for a second error symbol of a multi-bit error pattern, said peripheral circuit performs a correcting operation which involves writing a right data into a reference cell used for reading the second error symbol.

In still another aspect of the present invention, provided is an operation method of a semiconductor storage device which comprises data cells which store first to m-th block codes as error correction codes which allow error correction in units of symbols, first to $n^{th}$ reference cells, and a peripheral circuit containing first to $m^{th}$ ECC circuits, each of the error correction codes comprising a plurality of symbols, each of which comprises a plurality of bits. Each of said plurality of data cells and said first to $n^{th}$ reference cells includes any of a phase change resistance element, a metal oxide resistance element and a solid electrolyte resistance element. The operation method of the MRAM is configured to read data of the first to $m^{th}$ block codes are read out, while using an $i^{th}$ reference cell of the first to $n^{th}$ reference cells, when an $i^{th}$ symbol of each of the first to $m^{th}$ block codes is read, and to perform error detection on each of the first to $m^{th}$ block codes by using the first to $m^{th}$ ECC circuits, respectively, and, in a case where any of said first to $m^{th}$ ECC circuits detects a correctable error, for the m $i^{th}$ symbols read by using said $i^{th}$ reference cell, said peripheral circuit corrects a data in a data cell corresponding to an error bit when an error is detected in one of the $i^{th}$ symbols, and said peripheral circuit corrects a data said $i^{th}$ reference cell when errors are detected in two or more of the $i^{th}$ symbols.

According to the present invention, a technique capable of performing the error correction even if the data error occurs in any of the data cells and the reference cells in the PRAM, the ReRAM and the solid electrolyte memory is provided.

BRIEF DESCRIPTION OF DRAWINGS

FIG. 6 is a flow chart showing a read operation of the nonvolatile RAM in accordance with the first embodiment;

BEST MODE FOR CARRYING OUT THE INVENTION

Figure 1:
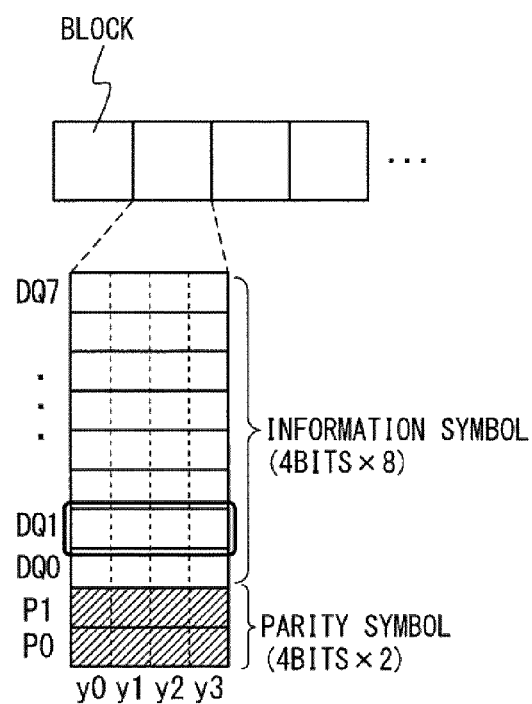
FIG. 1 is a conceptual view showing a code format of an error correction code used in a nonvolatile RAM in accordance with a first embodiment of the present invention.

Embodiments of a semiconductor storage device according to the present invention will be described below referring to the attached figures. The present invention may be applied to a PRAM using phase change resistance elements as memory cells, an ReRAM using a metal oxide resistance elements as memory cells and a solid electrolyte memory using solid electrolyte resistance elements as memory cells. Hereinafter, the PRAM, the ReRAM and the solid electrolyte memory are collectively referred to as the nonvolatile RAM. It should be noted that same or similar reference numerals in the figures are given to same or corresponding components.

First Embodiment (Structure of Nonvolatile RAM)

A nonvolatile RAM in a first embodiment of the present invention is configured so as to perform an error correction by using a block code in which one block is constituted of a plurality of symbols. According to the block code, coded data are divided into a plurality of blocks and each of the blocks is coded and decoded. Although, for example, a Hamming code, a BCH code, a Reed-Solomon code (RS code) are known block codes, Reed-Solomon code is used for the error correction in the first embodiment.

FIG. 1 is a conceptual view showing a code format used for error correction in the nonvolatile RAM in the present embodiment. It should be noted that the format shown in FIG. 1 does not represent a physical arrangement of the memory cell but merely represents a logical structure of data stored in the nonvolatile RAM.

In the present embodiment, a (10, 8) Reed-Solomon code is used. In other words, each block includes eight information symbols and two parity symbols. The information symbol and the parity symbol are each consisted of four bits. That is, in the present embodiment, eight parity bits are added to 32 data bits. The (10, 8) Reed-Solomon code enables an error correction of one symbol. Any number of bits with errors in one symbol can be corrected and the burst error can be also corrected.

One subject matter of the nonvolatile RAM in the present embodiment is to improve an accuracy of determining which of the data cell and the reference cell has the data error by optimizing allocation of the information symbols and the parity symbols to memory arrays and enable data correction in the case where an error exists in the reference cell. The nonvolatile RAM in the present embodiment will be described below in detail.

Figure 2:
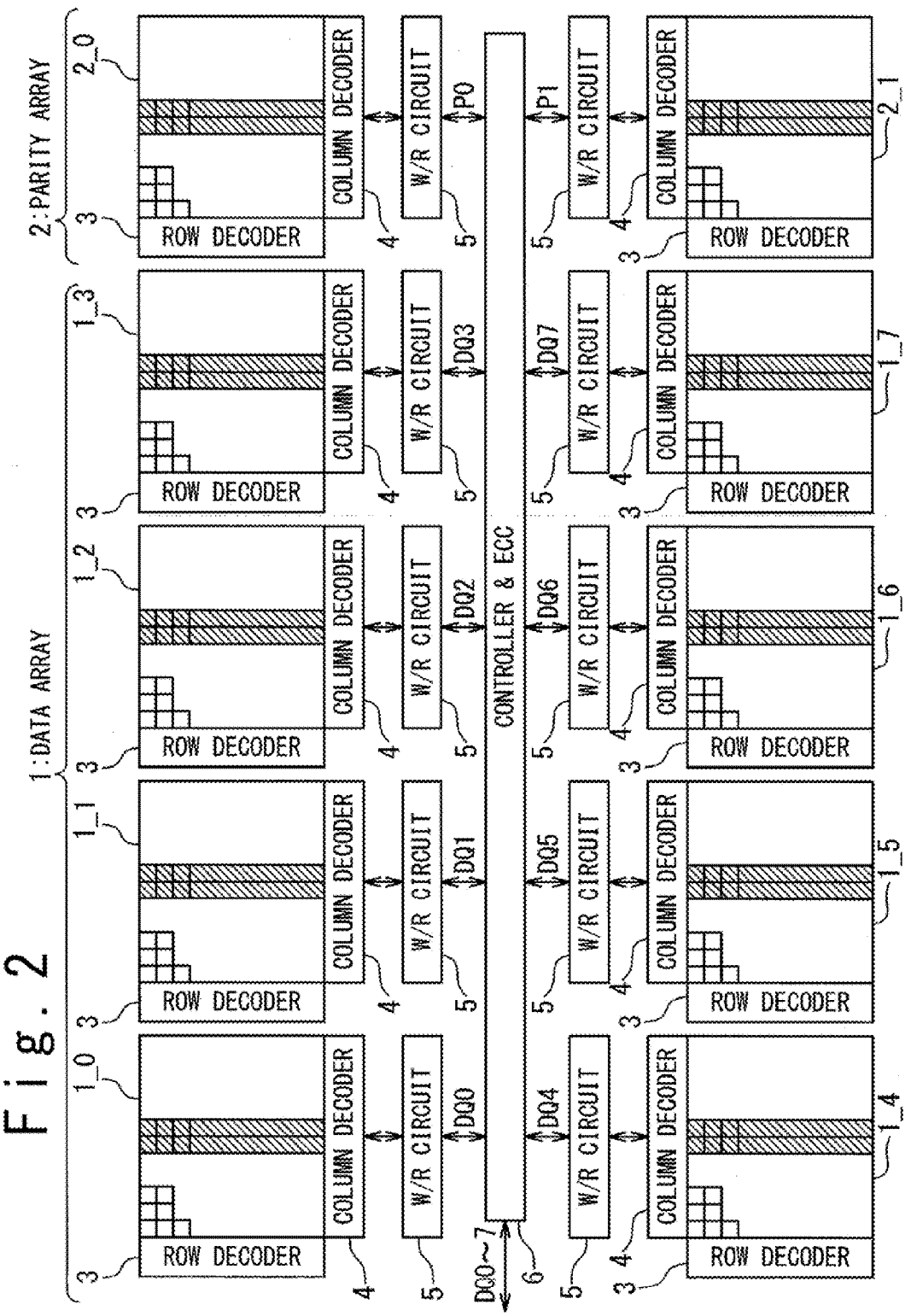
FIG. 2 is a block diagram showing structure of the nonvolatile RAM in accordance with the first embodiment of the present invention.

FIG. 2 is a block diagram showing a structure of the nonvolatile RAM 10 in accordance with the first embodiment of the present invention. The nonvolatile RAM 10 includes a plurality of memory arrays. When the nonvolatile RAM 10 is the PRAM, memory cells formed of phase change resistance elements are arranged in the memory arrays in a matrix and when the nonvolatile RAM 10 is the ReRAM, the memory cell formed of metal oxide resistance elements are arranged in the memory arrays in a matrix. Furthermore in the case where the nonvolatile RAM 10 is the solid electrolyte memory, the memory cells formed of solid electrolyte resistance elements are arranged in the memory arrays in a matrix.

The memory arrays of the nonvolatile RAM 10 is classified into two types: data arrays 1_0 to 1_7 and parity arrays 2_0, 2_1. Hereinafter, when the arrays are not distinguished from each other, the data arrays 1_0 to 1_7 are collectively described as the data array 1 and the parity array 2_0, 2_1 are collectively described as the parity array 2. The data array 1 is used to store the information symbols and the parity array 2 is used to store the parity symbols. The data arrays 1_0 to 1_7 are associated with the data inputs/outputs DQ0 to DQ7 of the nonvolatile RAM 10, respectively. At data writing, the information symbols are formed from written data inputted to the data inputs/outputs DQ0 to DQ7 and stored in the data arrays 1_0 to 1_7, while the parity symbols are generated from the information symbols and stored in the parity arrays 2_0, 2_1.

Access to the data array 1 and the parity array 2 is performed through peripheral circuits, specifically, a row decoder 3, a column decoder 4, a writing/reading circuit 5 and a controller 6. The row decoder 3 and the column decoder 4 are used to select the memory cell to be accessed. The writing/reading circuit 5 writes/reads data to/from the selected memory cell. The controller 6 has a function to control the row decoder 3, the column decoder 4 and the writing/reading circuit 5. The controller 6 further has a function to execute various operations for an error correction such as Reed-Solomon coding and an error detection.

Figure 3:
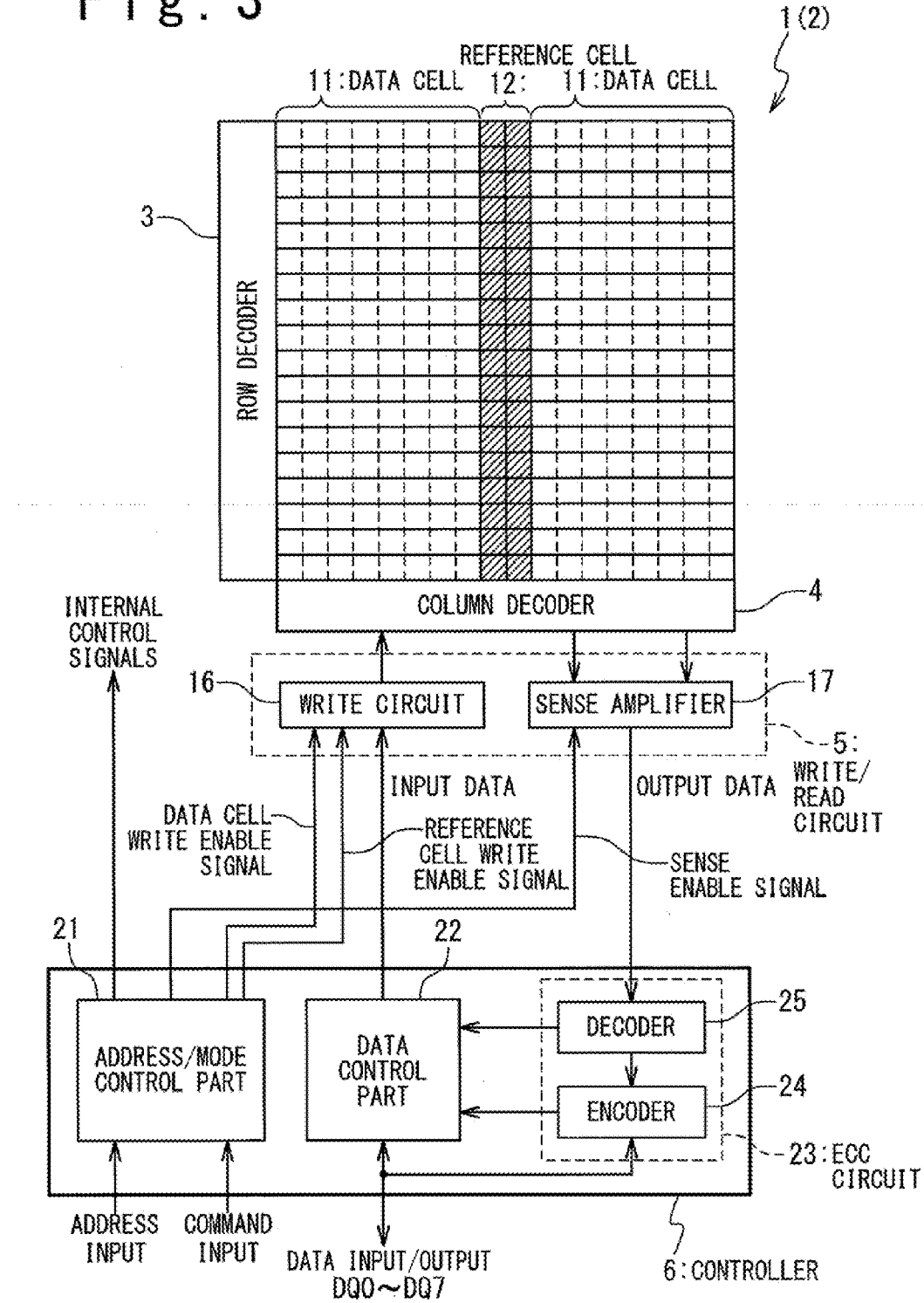
FIG. 3 is a detailed view showing a structure of a data array, a parity array, a writing/reading circuit and a controller in the first embodiment.
Figure 4A:
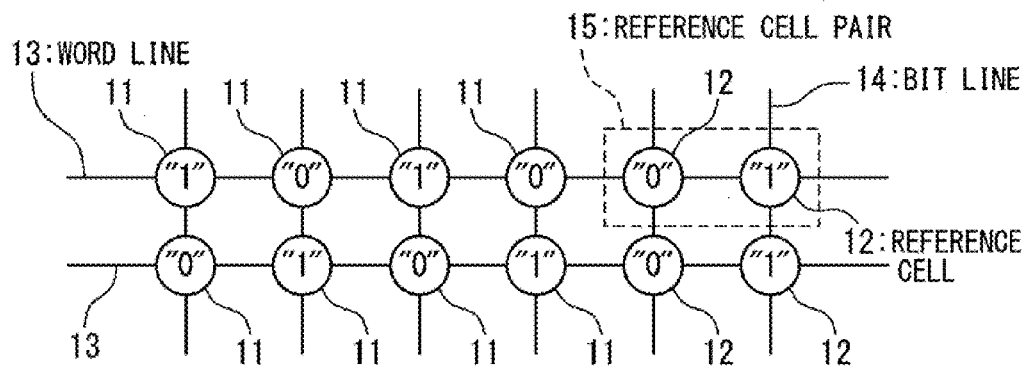
FIG. 4A is a detailed view showing a structure of the data array and the parity array in the first embodiment.

FIG. 3 is a block diagram showing a detailed structure of the nonvolatile RAM 10 in the present embodiment and shows a configuration of one data array 1 (or parity array 2) and a portion corresponding peripheral circuits. The memory cells arranged in the data array 1 and the parity array 2 are classified into two types: data cells 11 and reference cells 12. The reference cells 12 are placed in two columns. As shown in FIG. 4A, the data cells 11 and the reference cells 12 are disposed at positions where word lines 13 intersect with bit lines 14.

The two reference cells 12 located in a same row of the memory cell (in other words, connected to the same word line 13) form a reference cell pair 15. Complementary data is written to the two reference cells 12 contained in one reference cell pair 15. In reading data from one data cell 11, a current is passed through the two reference cells 12 located in the same row as the data cell 11 and the current generates a reference signal. The reference signal is generated so as to have a signal level between data "1" and data "0". Data in the data cell 11 is discriminated by comparing the reference signal with a data signal generated by passing the current through the data cell 11.

Figure 4B:
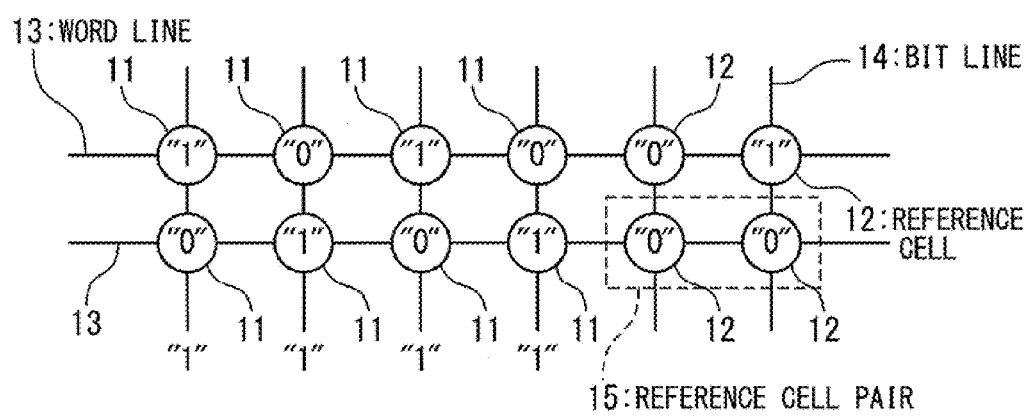
FIG. 4B is a diagram for explaining an operation of the nonvolatile RAM in the case where incorrect data is written in a reference cell.

To correctly read data from the data cell 11, it is important that one of the two reference cells 12 of the reference cell pair 15 holds the data "0" and the other holds the data "1". When both the reference cells 12 of the reference cell pair 15 hold, for example, the data "0" as shown in FIG. 4B, data stored in the corresponding data cell 11 tends to be discriminated as the data "1". In this case, a burst error is easy to generate.

Returning to FIG. 3, the reading/writing circuit 5 includes a writing circuit 16 and a sense amplifier 17. The writing circuit 16 writes inputted data to the data cell 11 and the reference cell 12 in response to a write enable signal supplied from the controller 6. The write enable signal is classified into two types: a data cell write enable signal and a reference cell write enable signal. When the data cell write enable signal is activated, the writing circuit 16 supplies a writing current (or writing voltage) for writing the inputted data to the data cell 11. Similarly, when the reference cell write enable signal is activated, the writing circuit 16 supplies a current (or voltage) for writing the above-mentioned data to be held to the reference cell 12. The sense amplifier 17 discriminates data in the selected memory cell, generates outputted data and outputs the data to the controller 6.

The controller 6 includes an address/mode control part 21, a data control part 22 and an ECC circuit 23. The address/mode control part 21 generates various internal control signals in response to an address input and a command input. The internal control signals are used to control the row decoder 3, the column decoder 4, the writing circuit 16 and the sense amplifier 17. The ECC circuit 23 performs an operation for error correction. The ECC circuit 23 includes an encoder 24 for performing error correcting coding and a decoder 25 for performing decoding and an error detection. The data control part 22 controls writing of data to the memory array 1 and reading of data from the memory array 1. Specifically, the data control part 22 receives read data (data subjected to the error correction as necessary) from the decoder 25 and outputs the data to the data inputs/outputs DQ0 to DQ7. The data control part 22 also generates the data cell write enable signal and the reference cell write enable signal and supplies the signals to the writing circuit 16. The data cell write enable signal and the reference cell write enable signal are activated (1) in the case where data and a write command are inputted, and (2) in the case where an error is detected in the data read by the decoder 25.

(Allocation of Information Symbols and Parity Symbols)

Figure 5A:
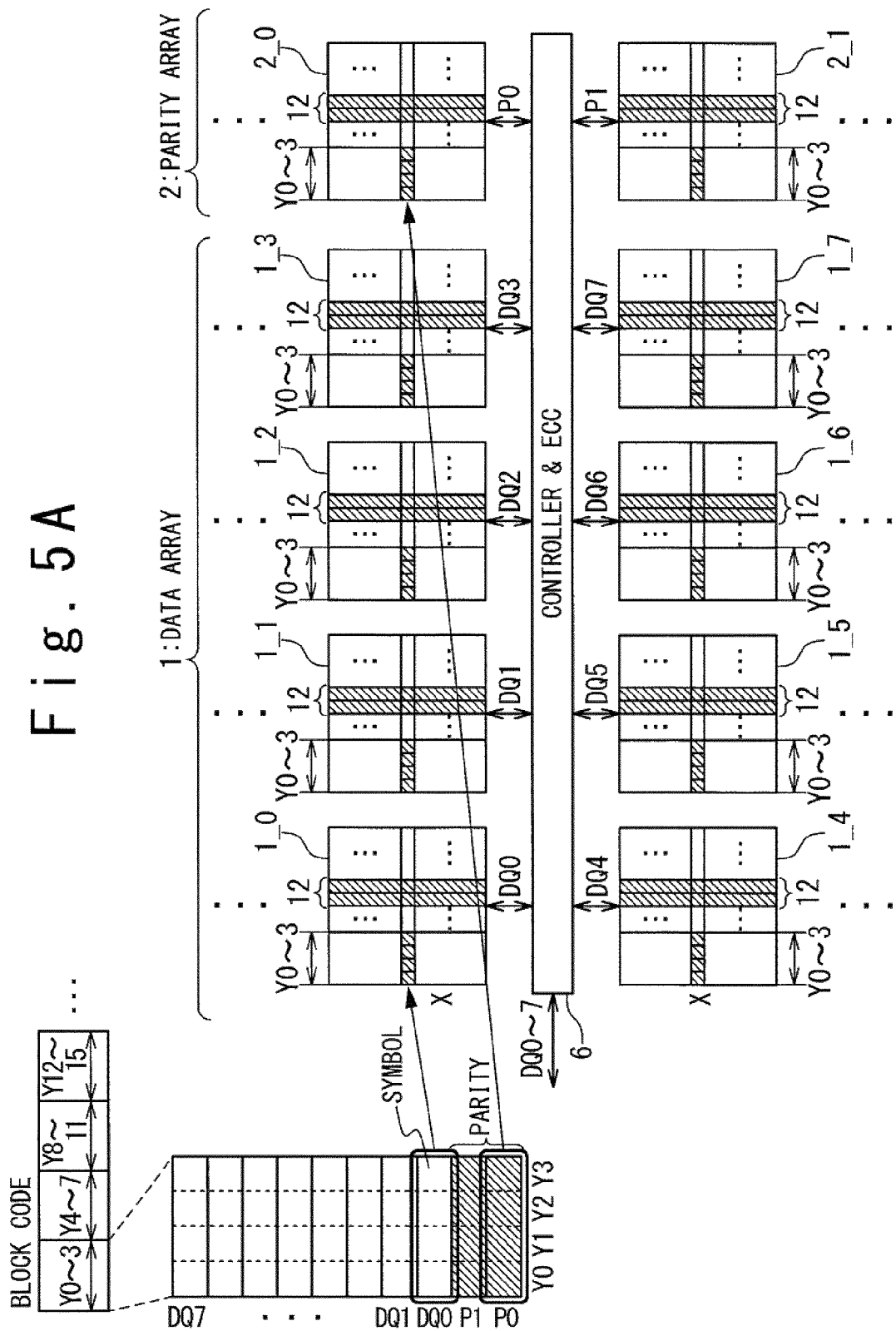
FIG. 5A is a conceptual view showing a method of allocating information symbols and parity symbols to the data array and the parity array in the first embodiment.

Referring to FIG. 5A, one of features of the nonvolatile RAM in the present embodiment is a method of allocating the information symbols and the parity symbols to the data array 1 and the parity array 2. In the nonvolatile RAM in the present embodiment, allocation of the information symbols and the parity symbols to the data array 1 and the parity array 2 is determined so that eight information symbols and two parity symbols in one block may be associated with different reference cells 12. In other words, the eight information symbols and two parity symbols in one block are read using the different reference cells 12.

More specifically, the eight information symbols in the block are associated with the different data inputs/outputs DQ0 to DQ7 and thus stored in the different data arrays 1. Hereinafter, the information symbols associated with the data inputs/outputs DQ0 to DQ7 are described as information symbols DQ0 to DQ7, respectively. In other words, the information symbols DQ0 to DQ7 are stored in the data arrays 1_0 to 1_7. Since each of the data arrays 1_0 to 1_7 is provided with a row of the reference cells 12, the information symbols DQ0 to DQ7 are read using the different reference cells 12. Four data cells 11 which store one information symbol therein are provided in the same row of the data array 1 and data in the four data cells 11 is read using the reference cells 12 in the same row. Thus, the eight information symbols are read using the different reference cells 12.

Column addresses of the data cells 11 in which the information symbols DQ0 to DQ7 in one block are stored are uniform in the data arrays 1_0 to 1_7. For example, the information symbols DQ0 to DQ7 in one block are stored in the data cells 11 identified by a row address X and column addresses Y0 to Y3. Such structure simplifies selection of the data cells 11, which is suitable.

In addition, the two parity symbols in the block are associated with different parity arrays 2 and stored therein. Hereinafter, the parity symbols associated with the parity arrays 2_0, 2_1 are described as parity symbols P0, P1. Since the parity symbols P0, P1 are separately stored in the parity arrays 2_0, 2_1 prepared separately from the data arrays 1_0 to 1_7, the parity symbols P0, P1 are read using a different reference cells 12 other than the reference cell 12 used for reading the information symbols DQ0 to DQ7. Four data cells 11 which store one parity symbol are provided in the same row of the data array 1 and data in the four data cells 11 is read using the reference cell 12 located in the same row.

Figure 5B:
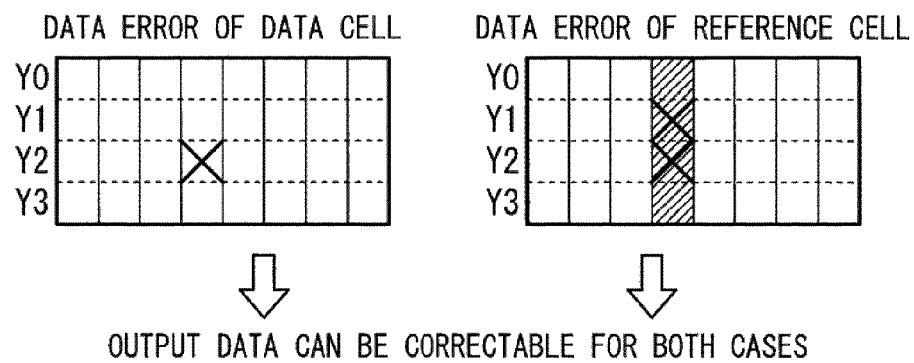
FIG. 5B is a diagram for explaining examples of a data error requiring correction of the data cells and a data error requiring correction of the reference cell.

Advantages of such allocating method are that it can be correctly decided which of the data cell 11 and the reference cell 12 has an error at a high probability and that in each case, correct read data can be identified through an error correction and outputted to the outside. As shown in FIG. 5B, when a data error rate of the memory cell is sufficiently low, the data error in the data cell 11 appears as a single bit error and the data error in the reference cell 12 appears as a burst error in a single symbol in many cases. By correcting data in the corresponding data cell 11 in the case where the single bit error is detected and correcting data in the reference cell 12 in the case where the burst error is detected, appropriate data cell 11 or reference cell 12 can be correctly corrected at a high probability.

It should be noted that correct read data can be obtained through the error correction even if the data error in the reference cell 12 causes the burst error. Since the information symbols and the parity symbols in one block are associated with different reference cells 12, respectively, the burst error generated due to the data error in one reference cell 12 appears in a single symbol. Since the (10, 8) Reed-Solomon code can correct the error of one symbol, as long as the data error occurs in a single reference cell pair 15, the symbol can be reliably corrected to obtain correct read data.

(Read Operation)

Procedure of data reading employing an advantage of the above-mentioned allocation method will be described below. FIG. 6 is a flow chart showing a suitable read operation of the nonvolatile RAM in the present embodiment. In the read operation of the nonvolatile RAM in the present embodiment, first, reading data from the data cell 11 and an error detection is performed (Step S01).

Reading data from the data cell 11 is performed for each block. When an address input is given, the data cell 11 which stores all of the information symbols and the parity symbols belonging to the block corresponding to the address input is selected. Simultaneously, the reference cell 12 located in the same row as the selected data cell 11 is selected. Subsequently, data bit is read from the selected data cell 11.

In reading data from the selected data cell 11, two reference cells 12 of the reference cell pair 15 located in the same row as the selected data cell 11 are used. Specifically, an average current of currents passing through the two reference cells 12 is compared with a current passing through the data cell 11 by the sense amplifier 17 and the data bits of the data cell 11 are determined. The data bit of the data cell 11 thus read is sent to the decoder 25 of the ECC circuit 23 and then, an error detection is performed. In one embodiment, the ECC circuit 23 calculates a syndrome from the read data bit and an error detection is performed based on the syndrome.

In the case where no error is detected, data read from the target data cell is outputted as outputted data (Step S02).

On the other hand, in the case where an error is detected, the ECC circuit 23 determines whether or not the error correction can be performed (Step S03). In the case where it is determined that the error correction cannot be performed, the ECC circuit 23 outputs an error signal to the outside (Step S12). Thus, the read operation is interrupted.

In the case where it is determined that the error correction can be performed, the ECC circuit 23 calculates correct read data and outputs the data to the outside. As mentioned above, in the present embodiment using the (10, 8) Reed-Solomon code, when the data error exists only in a single information symbol, correct read data can be calculated even with any bit of error.

Subsequently, the error in the data cell 11 or the reference cell 12 is corrected.

Specifically, in the case where the error detected at Step S01 is not a single bit error (in other words, a multi-bit error is detected in one information symbol), data stored in the reference cell 12 corresponding the information symbol or the parity symbol having the found data error is corrected under control of the data control part 22 (Step S11). In the case where the multi-bit error is detected in one information symbol, the data control part 22 activates the reference cell write enable signal and permits the reading circuit 16 to feed the writing current to the reference cell 12. Correction of the reference cell 12 is performed by writing data to be programmed, in other words, data 20" to one reference cell 12 and data "1" to the other reference cell 12. According to the correcting operation of the reference cell 12, the memory can be put into the usable state for data reading can. After the error correction of the reference cell 12 (Step S11), the read operation is completed.

On the other hand, when the error detected at Step S01 is a single bit error, data stored in the data cell 11 is corrected under control of the ECC circuit 23 (Step S05). In other words, data in the data cell 11 determined to have a data error among the selected data cells 11 is inverted. Data inversion is performed by writing error correction data outputted from the ECC decoder 25 to the data cell 11 having the error. More specifically, the data control part 22 sends data subjected to the error correction, which is received from the ECC decoder 25, to the writing circuit 16, activates the data cell write enable signal and permits the writing circuit 16 to feed a writing current or a writing voltage to the data cell 11. After the error correcting operation of the data cell (Step S05), the read operation is finished.

Figure 7:
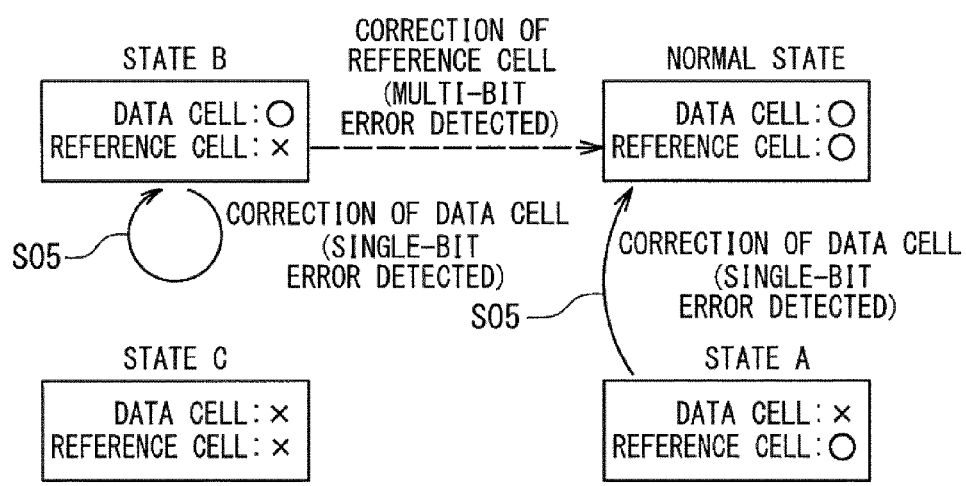
FIG. 7 is a diagram showing state shift of the nonvolatile RAM in performing a read operation in the first embodiment.

Here, using FIG. 7, state shift of the data cell 11 and the reference cell 12 in the present embodiment is confirmed. In FIG. 7, the "data cell: ○" represents a state where the data cell 11 has no error and the "data cell: x" represents a state where the data cell 11 has 1 bit of error. The "reference cell: ○" represents the state where the reference cell 12 has no error and the "reference cell: x" represents a state where the reference cell 12 has an error.

Under a condition that the probability of occurrence of the soft error is sufficiently suppressed, that is, the data error exists only in one memory cell among the data cells 11 and the reference cells 12, in the case were the data error is found, either of the following two states: a state A where the error exists only in the data cell 11 and a state B where the error exists only in the reference cell 12 is considered. That is, a state C where the errors exist in both the data cell 11 and the reference cell 12 is stochastically impossible. In the case where the error state is the state A, since the error detection results in the single bit error, the memory is shifted into the normal state at Step S05. In the case where the error state is the state B, the error detection results in the multi-bit error in many cases. Therefore, the memory is shifted into the normal state at Step S11. However, though at a low probability, the error detection may result in the single bit error. This is due to that even when the reference cell 12 has an error, the single bit error is accidentally detected because of resistance characteristic of the reference cell 12. This probability cannot be ignored when the number of bits in the symbol is small. In this case, since a correcting operation of the data cell 11 having no error is performed (Step S05), the error in the reference cell 12 cannot be corrected. However, in the case where the data cell 11 corresponding to another block code which reads data using the reference cell 12 including the error is accidentally accessed after a relatively short time, if the error detected at Step S01 is the multi-bit error, the error in the reference cell 12 can be corrected through Step S11.

Figure 8:
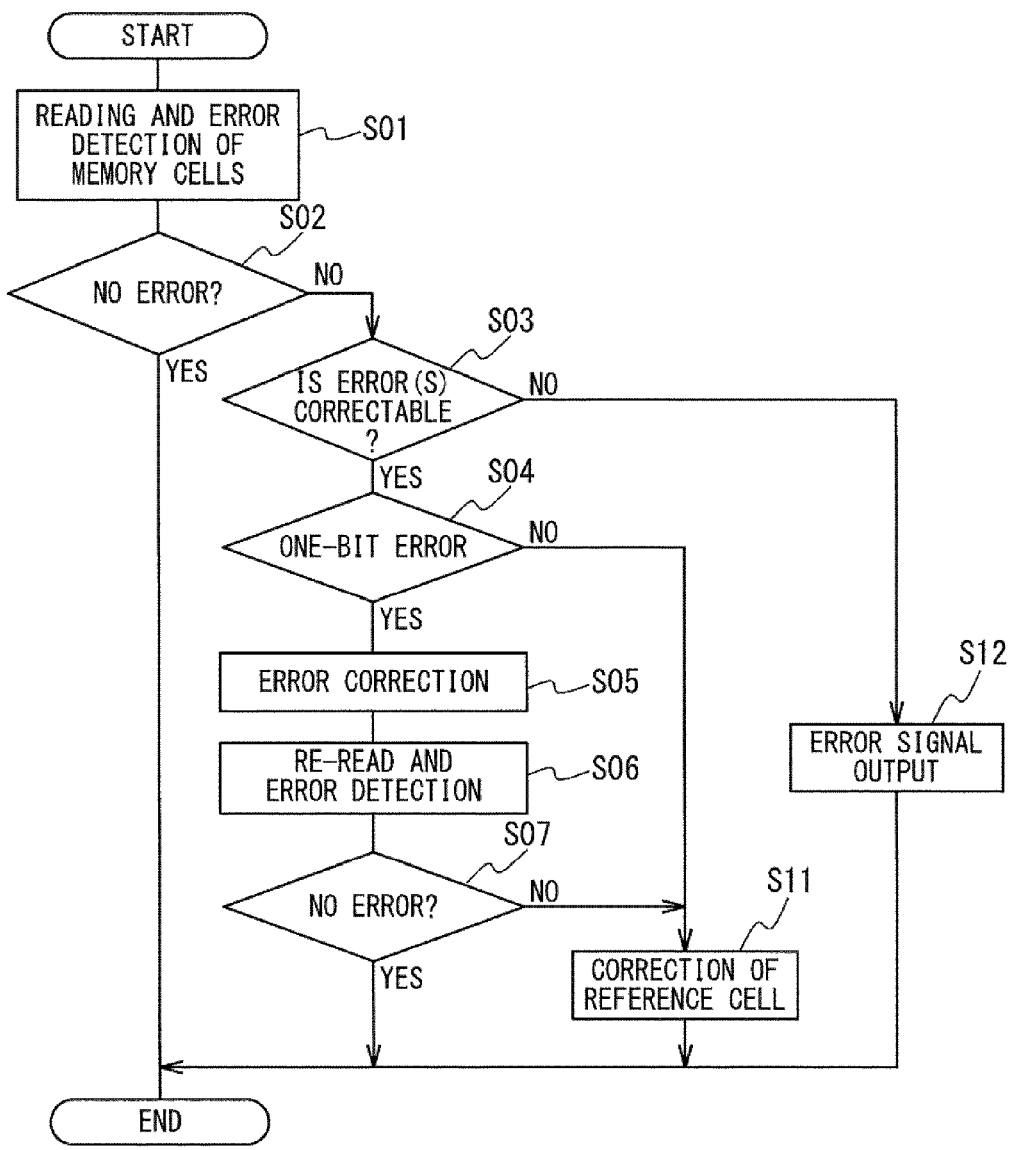
FIG. 8 is a flow chart showing another read operation of the nonvolatile RAM in accordance with the first embodiment.

FIG. 8 shows a correction flow of reliably correcting the error in both the data cell 11 and the reference cell 12 without increasing the number of writing circuits 16. Specifically, in the case where the error detected at Step S01 is the multi-bit error, the reference cell 12 is corrected (Step S11). In the case where the error detected at Step S01 is the single bit error, the data cell 11 determined to have the data error are corrected (Step S05). After Step S05, reading and the error detection are performed again (Step S06) and when the results represent no error, the read operation is finished. When the results at Step S06 represent any error, the correcting operation of the reference cell 12 is unconditionally performed (Step S11). In this correction flow, when the probability of occurrence of the soft error is sufficiently suppressed so that the data error exists only in one memory cell, both the data cell 11 and the reference cell 12 can be reliably corrected. However, when the error detected at Step S01 is the single bit error, since a re-read operation is required, the control circuit and operational timing are disadvantageously complicated.

(Write Operation)

Next, a write operation will be described. When a write command is inputted, the ECC encoder 24 creates a data pattern of the parity symbols corresponding to inputted data. However, creation of the parity symbols requires information of all bits of the information symbols. In other words, in the example of the block code shown in FIG. 1, information of bits corresponding to y0 to y3 of the information symbols associated with DQ0 to DQ7 is required to create two parity symbols. Therefore, in the case where bit information of all information symbols in the block code in a write cycle is inputted according to operational specification of the non-volatile RAM, the parity symbols can be created in the cycle and bit information of the information symbols and the created parity symbols can be simultaneously written.

As a specific example, it is assumed that one write cycle is performed in four clock cycles. Data in the information symbol at the address y0 in a first clock cycle, data in the information symbol at the address y1 in a second clock cycle, data in the information symbol at the address y2 in a third clock cycle and data in the information symbol at the address y3 in a fourth clock cycle are serially inputted from DQ0 to DQ7. Furthermore, in the fourth clock cycle, the parity symbols are created by the ECC encoder 24, and then, the information symbols of 32 bits in total and the parity symbols of 8 bits in total are simultaneously written to the corresponding memory cells.

However, only a part of bit information of the information symbols of the block code in the write cycle is inputted according to the operational specification of the nonvolatile RAM, bit information of remaining information symbols needs to be detected to create the parity symbols. In other words, also in the write cycle, it is need to pre-read all storage data of the information symbols and the parity symbols belonging the block code, which is stored in the memory cells.

Figure 9:
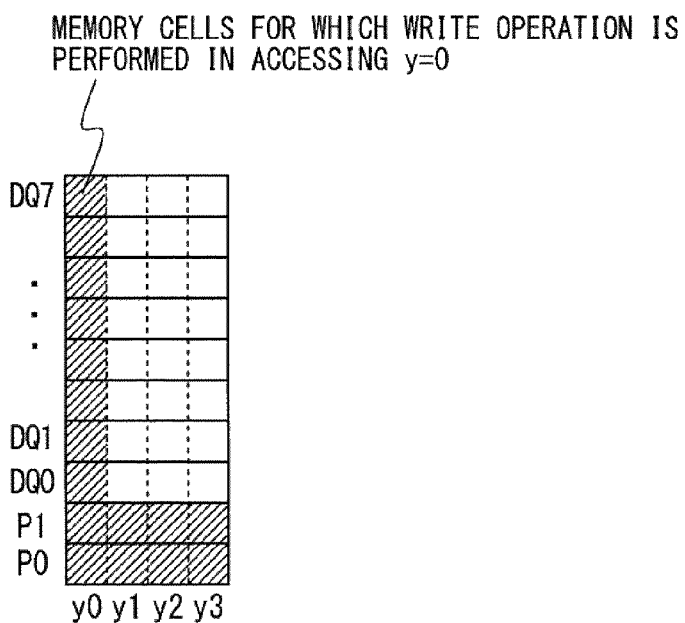
FIG. 9 is a conceptual view showing data cells to which data is actually written when an address is selected in the write operation.

As a specific example, as shown in FIG. 9, in one write cycle, write data of the bits at the input address y0 and belonging to the y0 of the information symbol is inputted from the DQ0 to DQ7. At this time, prior to the write operation, stored bit information belonging to the y0 to y3 of the information symbols is pre-read. The ECC encoder 24 creates new parity symbols P0, P1 based on the pre-read bit information of the information symbols belonging to pre-read y1 to y3 and inputted data belonging to the inputted y0. Next, a write operation of the 8 bit memory cells belonging to y0 as a part of the information symbols and the write operation of the 8 bit memory cells belonging to the y0 to y3 of the parity symbols are simultaneously performed (memory cells of the bits shown by diagonal lines in FIG. 9) and the write cycle is finished.

Desirably, the parity symbols is created by the ECC encoder 24 by using an error detection result outputted from the ECC decoder 25 in response to the pre-read result rather than by using the pre-read result outputted from the sense amplifier 17. The reason is as follows: in the case where an error bit exists in the memory cell other than the memory cell in which writing is actually performed (in the above-mentioned example, the error bit exists in the memory cells belonging to y1 to y3 of the information symbols), incorrect parity symbols are created due to the information symbols including the error bit, thereby causing illegible data in units of block code. That is, when the parity symbols are created by using the pre-read result, the error bit existing in the regions of the y1 to y3 of the information symbols cannot be detected due to the incorrectly created parity symbols. When the error detection result of the ECC decoder 25 represents that no error bit exists or the error bit is a bit which can be replaced with inputted data (in the above-mentioned example, bits belonging to the y0) or a parity bit of a parity symbol to be created after this, there causes no problem.

When the error detection result obtained by the pre-read operation reveals that the error bit exists in the memory cells other than the memory cells to be written, desirably, the error bit can be simultaneously corrected in a same write cycle. For example, according to the correction flow shown in FIG. 6 using the burst error correction code, data can be written to the memory cells to be written and the memory cell with error bit at the same time. However, there is a problem that the writing circuits corresponding to the number of the memory cells forming the block code and the number of the reference cells used for reading the memory cells need to be prepared, thereby complicating a circuit structure of the address decoder. One example of efficiently performing the error correction without overhead of the circuit area in the write operation is to perform the read/write operation in units of block code. For example, in the block code shown in FIGS. 1 and 9, the write operation should be performed in units of four write cycles corresponding to the y0 to y3. In each write cycle, the pre-read operation in the block code and the write operation to the memory cell of the information symbols selected in the write cycle and the parity bits are performed. Even when the error bit is detected in the unselected memory cells of the information symbols in one write cycle, the error bit is replaced with inputted data in another write cycle, which is substantially equivalent to the error correction. In the present embodiment, although the error in the reference cell 12 cannot be corrected in the write mode, when the read operation of the block code is performed, the error can be detected and corrected according to the above-mentioned correction flow (FIG. 6 and FIG. 8). Generally, in many applications, the number of times of the read operation is larger than that of the write operation and there is a strong possibility that the error in the reference cell which is detected in the write operation can be corrected in the subsequent read operation.

According to the above-mentioned write operation, even if the reference cell 12 has an error, data can be correctly written and the nonvolatile RAM can be restored into the normal state at a high probability.

Second Embodiment

One problem of the read operation of the nonvolatile RAM in accordance with the first embodiment is, as shown in FIG. 8, after correction of the data cell 11 (Step S05), data needs to be read again to increase reliability of an error correction. Reading data again is undesirable as it increases the number of read cycles. In a second embodiment, architecture of the nonvolatile RAM for making read data from the data cell 11 unnecessary is provided.

Figure 10A:
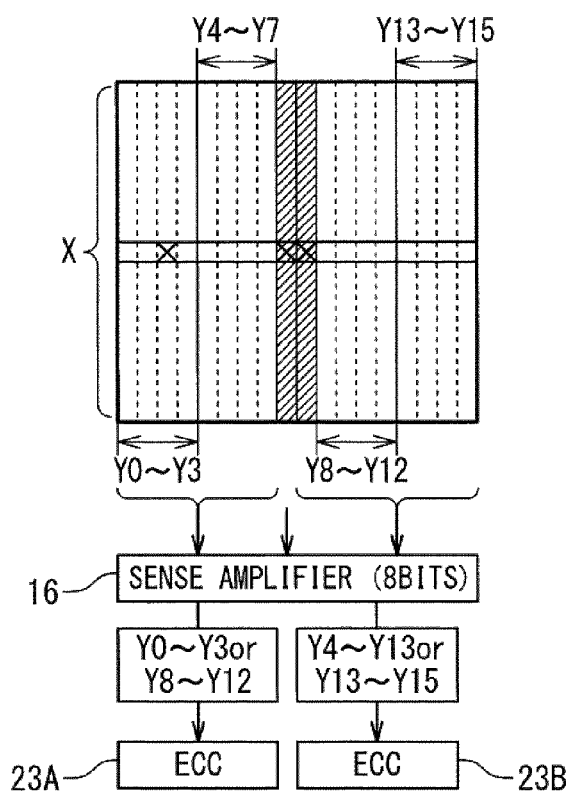
FIG. 10A is a diagram partially showing a structure of a nonvolatile RAM in accordance with a second embodiment of the present invention.

FIG. 10A is a diagram partially showing a structure of a nonvolatile RAM in accordance with the second embodiment of the present invention. The controller 6 is provided with two ECC circuits 23A, 23B. The ECC circuits 23A, 23B each has an ability to detect and correct error in data of 1 block.

In addition, in the nonvolatile RAM in the present embodiment, when a read address is designated from the outside, reading of two blocks is performed. One block is a block corresponding to the read address and the other block is a block formed of the information symbols and the parity symbols read using a same reference cell as the reference cell used to read the information symbols and the parity symbols which form the one block.

More specifically, the sense amplifiers 17 connected to the data array 1 and the parity array 2 each is configured to read data of two symbols (that is, data of 8 bits) using a same reference cell pair 15. As described above, since one block includes 8 information blocks stored in the data arrays 1_0 to 1_7, respectively, and two parity blocks stored in the parity arrays 2_0, 2_1, respectively, the two blocks are read by reading the two symbols at a same address from the data array 1 and the parity array 2.

For example, when a row address X and a column address Y0 are designated as a read address, in each of the data array 1 and the parity array 2, symbols stored in the data cells 11 at the row address X and the column addresses Y0 to Y3 and symbols stored in the data cells 11 at the row address x and the column addresses Y4 to Y6 are read by using the reference cell 12 of the reference cell pair 15 selected at the row address X. From each of the data array 1 and the parity array 2, the symbols corresponding to the row address X and the column address Y0 to Y3 are sent to the ECC circuit 23A and the symbols corresponding to the row address X and the column address Y4 to Y7 are sent to the ECC circuit 23B. The ECC circuits 23A, 23B perform an error detection and an error correction of the above-mentioned two blocks by using the symbols sent thereto.

In the nonvolatile RAM thus configured in the second embodiment, the data cell 11 and the reference cell 12 are corrected in the following procedure to make read data to be corrected from the data cell 11.

Figure 11:
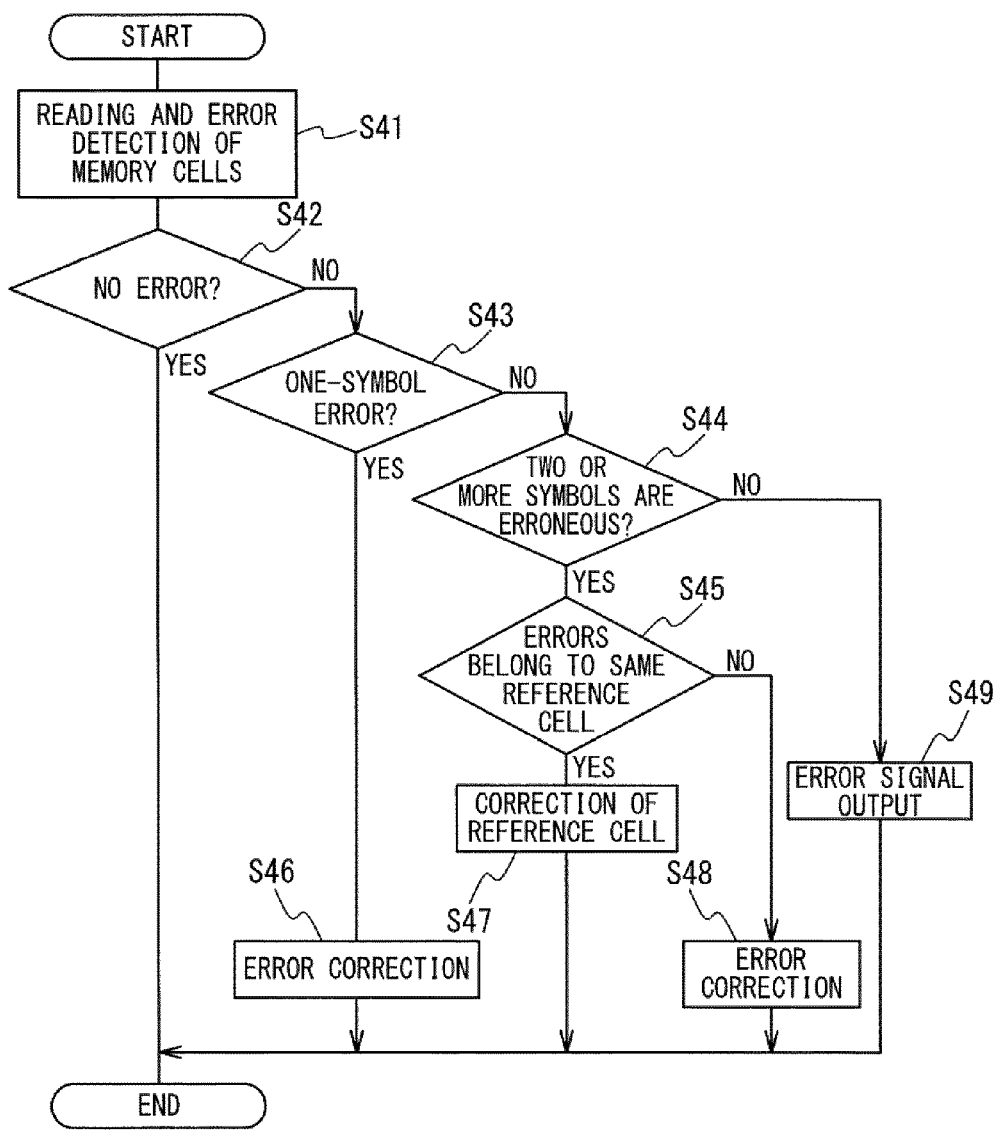
FIG. 11 is a flow chart showing a read operation of the nonvolatile RAM in accordance with the second embodiment.

Referring to FIG. 11, first, the data reading and the error detection are performed (Step S41). In data reading, as described above, one block and the block corresponding to the read address, is read from the data array 1 and the parity array 2 and an error detection of the two read blocks is performed.

In the case where no error is detected, data read from the data cell 11 designated by the read address is outputted as read data to the outside and the read operation is finished (Step S42).

In the case where an error is detected, the data cell 11 or the reference cell 12 are corrected depending on the type of the error.

Figure 10B:
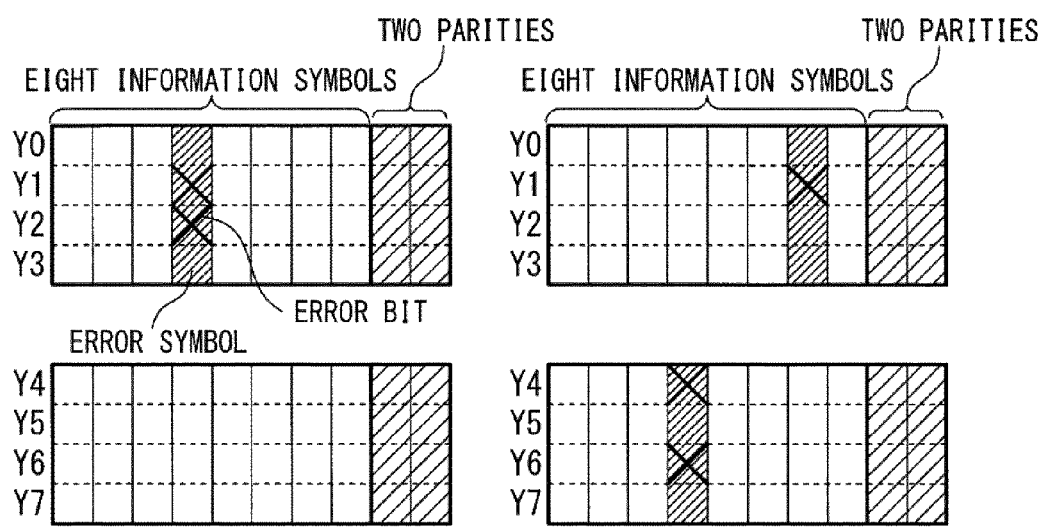
FIG. 10B is a diagram showing a data error to be corrected in a data cell in the nonvolatile RAM in accordance with the second embodiment.

In the case where the error is detected in only one symbol through the two blocks (Step S43), correct read data is calculated by the error correction and the calculated correct data is outputted to the outside. Furthermore, as shown in a left figure of FIG. 10B, data in the data cell 11 with the data error among the data cells 11 corresponding to the symbol is corrected (Step S46) and the read operation is finished.

When an error is detected in two or more symbols of any one of the blocks, an error correction cannot be performed. In this case, the error signal is outputted and the read operation is finished (Step S49).

Figure 10C:
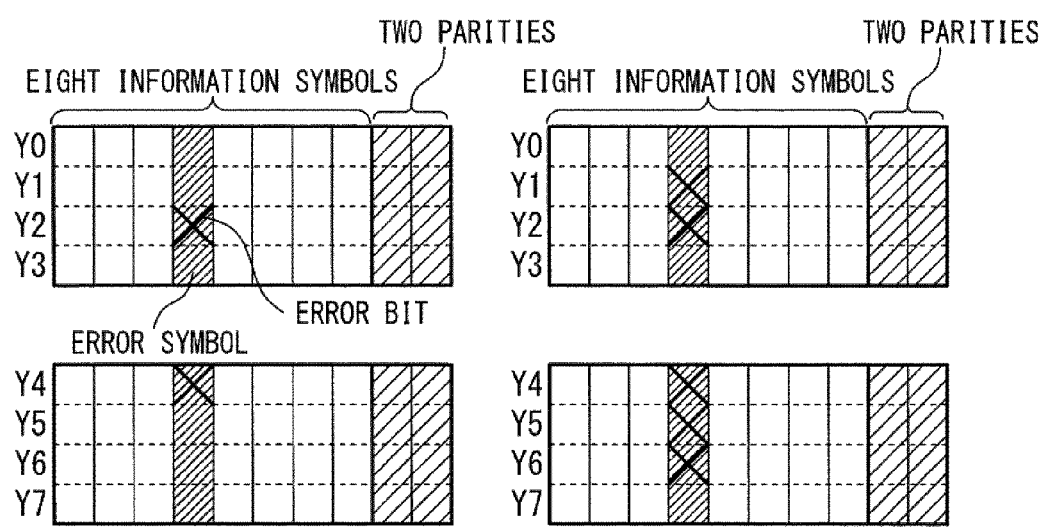
FIG. 10C is a diagram showing data errors to be corrected in reference cell in the nonvolatile RAM in accordance with the second embodiment.

Other than the above-mentioned cases, there is a case where an error is detected in one symbol of each of two blocks. In this case, the error correction can be performed. In doing so, after correct read data calculated by the error correction is outputted to the outside, an appropriate memory cell of the data cell 11 and the reference cell 12 are corrected. Specifically, when the two symbols with detected errors correspond to the same reference cell 12 (Step S45), as shown in FIG. 10C, the reference cell 12 is corrected (Step S47). On the other hand, in the case where the two symbols with detected error correspond to different reference cells 12, as shown in a right figure in FIG. 10B, the data cell 11 is corrected (Step S48). When correction of the data cell 11 or the reference cell 12 is finished, the read operation is completed.

In the read operation of the nonvolatile RAM in the present embodiment, even if data is not read again after correction of the data cell 11, correction of the data cell 11 and the reference cell 12 can be corrected at a high probability. In the case where an error exists in one reference cell 12, errors occurs in two symbols corresponding to the reference cell 12 at a high probability, and it is actually unlikely that an error occurs in only one symbol. Except for the case where the two symbols with detected errors correspond to the same reference cell 12, the detected errors may be determined as errors in the data cells 11. Accordingly, in the read operation of the nonvolatile RAM in the present embodiment, even if the data cells 11 are corrected and it is verified whether or not the correction is correct, the data cells 11 and the reference cell 12 can be correctly corrected at a high probability.

Although controller 6 is provided with the two ECC circuits in the nonvolatile RAM in FIG. 10A, the controller 6 may be provided with three or more ECC circuits to simultaneously read three or more blocks. In this case, if an error is detected in two or more symbols corresponding to the same reference cell 12, the reference cell 12 is corrected and if not so, the data cells 11 are corrected.

Third Embodiment

Another problem of the nonvolatile RAM in the first embodiment is that the write operation concentrates in the parity array 2. For example, in the case of PRAM which feeds a current to a memory cell for writing, the writing current intensively passes to the parity array 2 in the write operation. More specifically, referring to FIG. 9, in the case where data at one address (for example, column address Y0) is rewritten, for the data array 1, 1 bit corresponding to the address is written. However, for the parity array 2, since all of the parity symbols need to be rewritten, it is need to write 4 bits. This increases the writing current passed to the parity array 2 in comparison with the current passed to the data array 1. Such nonuniformity of the writing current leads to a local change in a power voltage. In the case where the symbol includes more bits, nonuniformity of the writing current becomes larger. Such nonuniformity of the writing current can lower reliability of the operation of the nonvolatile RAM, which is undesirable. In a third embodiment, architecture of the nonvolatile RAM to solve nonuniformity of the writing current.

Figure 12:
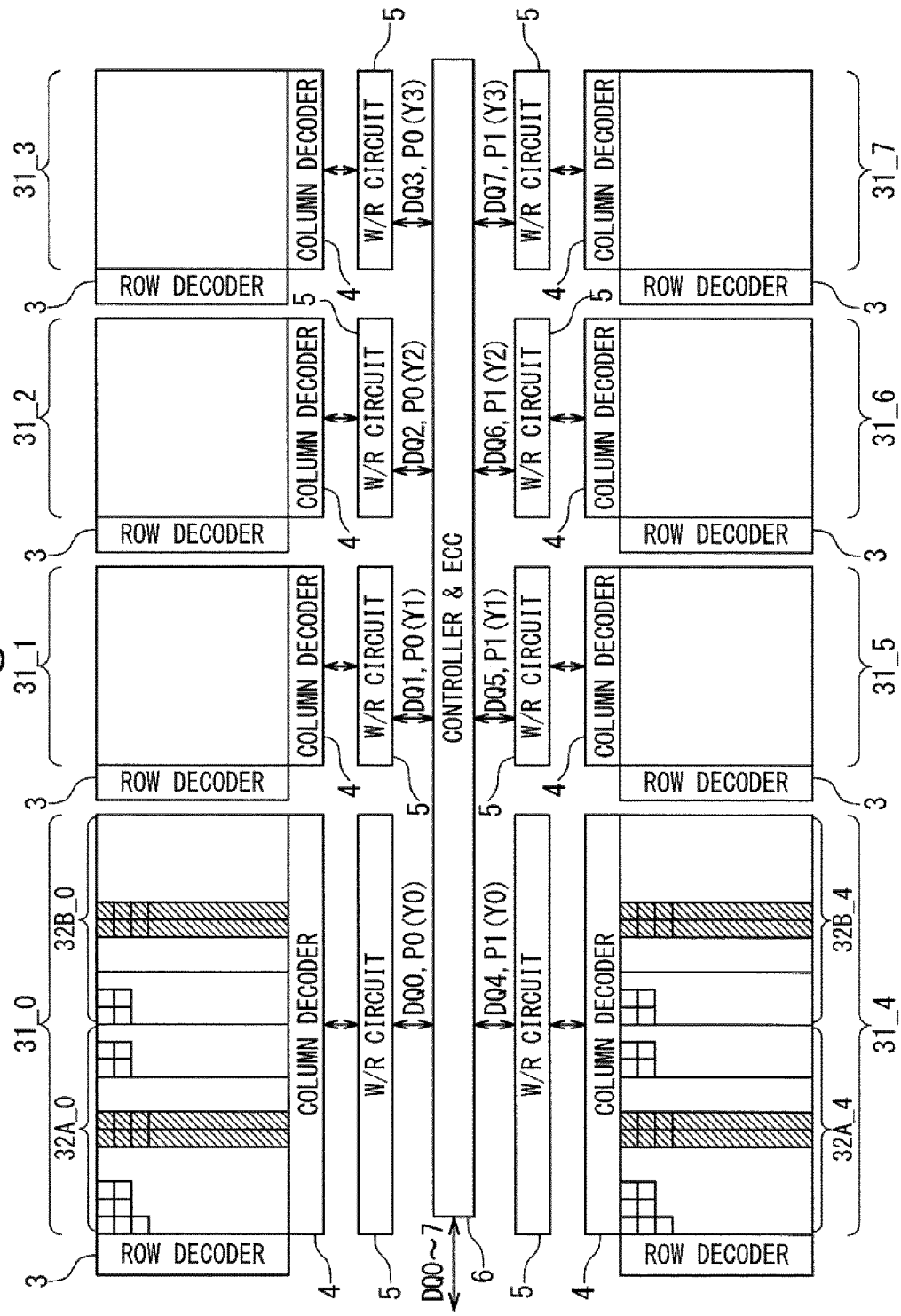
FIG. 12 is a block diagram showing structure of a nonvolatile RAM in accordance with a third embodiment of the present invention.

FIG. 12 is a block diagram showing a structure of the nonvolatile RAM in the third embodiment. In the nonvolatile RAM in the present embodiment, bits forming the parity symbol are distributed and stored in memory arrays 31_0 to 31_7. The memory arrays 31_0 to 31_7 have a same structure and in the case where the memory arrays need not be distinguished, they are correctively referred to as a memory array 31. It should be noted that in FIG. 12, for simplicity of the figure, a structure of the memory arrays 31_0, 31_4 is shown in detail.

Figure 13:
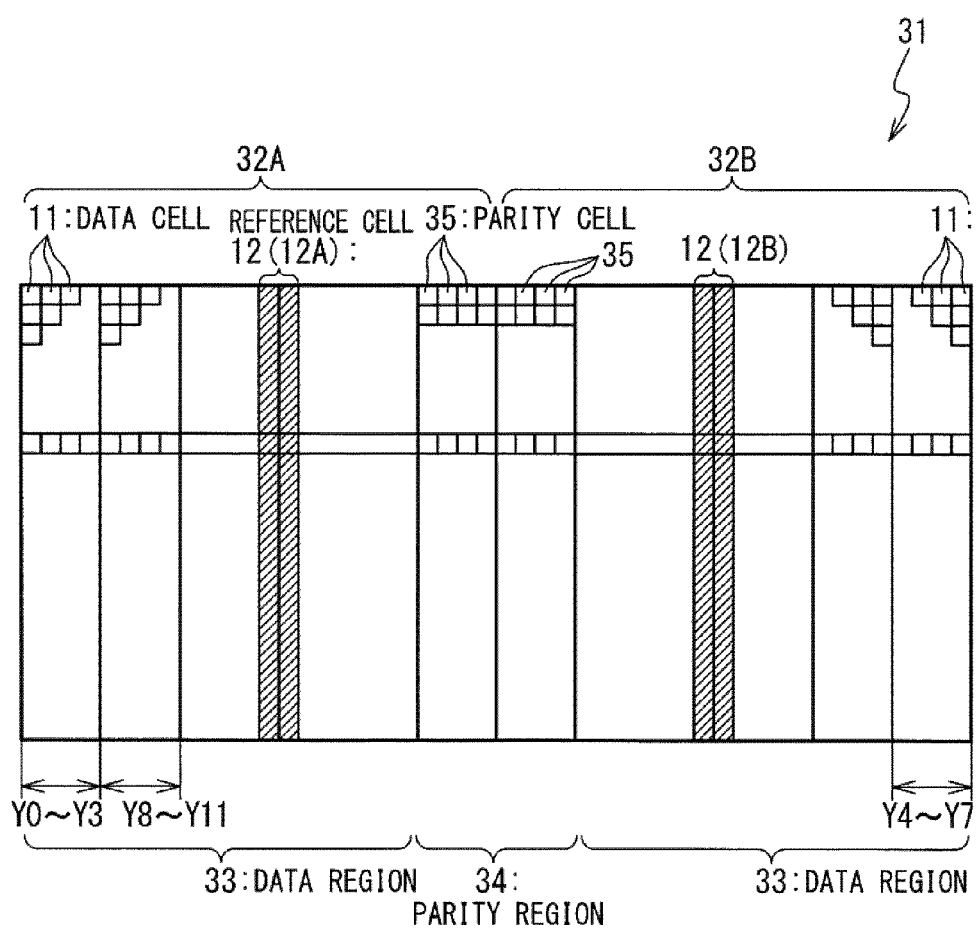
FIG. 13 is a conceptual view showing a structure of a memory array of the nonvolatile RAM in accordance with the third embodiment.

More specifically, as shown in FIG. 13, each memory array 31 includes two memory areas: memory areas 32A, 32B. The memory areas 32A, 32B each includes a data region 33 and a parity region 34. The data cells 11 and the reference cells 12 are arranged in the data region 33 and parity cells 35 as memory cells for storing parity symbols therein are arranged in the parity region 34. The reference cells 12 are arranged in the data regions 33 of the memory areas 32A, 32B in two rows. The data bits of the data cells 11 and the parity cells 35 which are arranged in the memory area 32A are read using the reference cell 12 arranged in the memory area 32A (hereinafter referred to as reference cell 12A) and the data bits of the data cells 11 and the parity cells 35 arranged in the memory area 32A are read using the reference cell 12 arranged in the memory area 32B (hereinafter referred to as reference cell 12B).

Figure 14:
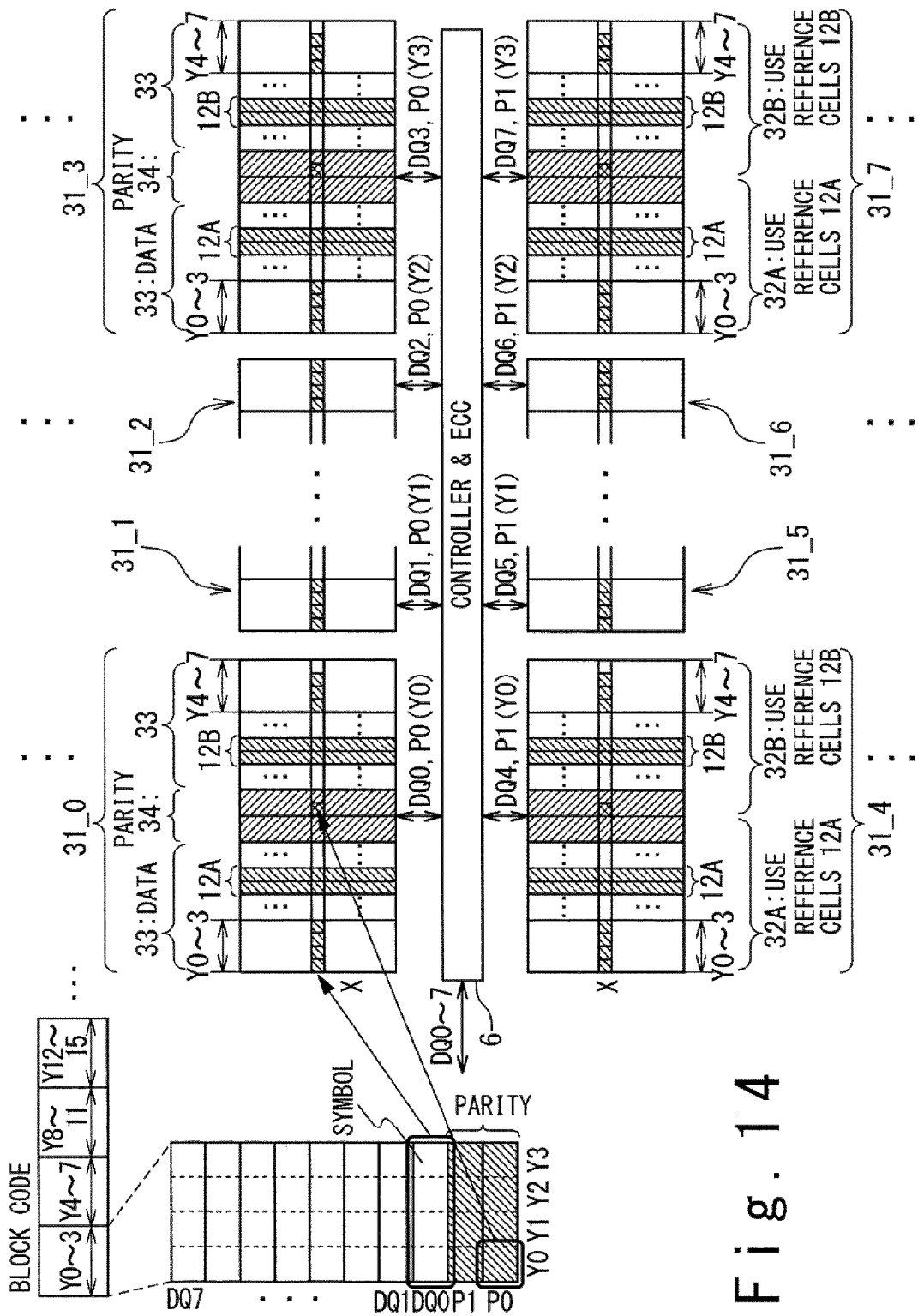
FIG. 14 is a conceptual view showing a method of allocating the information symbols and the parity symbols to memory arrays.

FIG. 14 is a diagram showing a method of allocating the information symbols and the parity symbols to the data array 1 and the parity array 2 in the nonvolatile RAM in the present embodiment. The method of allocating the information symbols and the parity symbols in the nonvolatile RAM in the present embodiment is characterized by that the information symbols and the parity symbols are allocated to the memory arrays 31 so that eight information symbols and eight parity bits may be read using different reference cells 12.

More specifically, in the present embodiment, eight information symbols DQ0 to DQ7 in one block are stored in the data regions 33 of the memory arrays 31_0 to 31_7, respectively. The data cells 11 which stores four bits of each information symbol therein are disposed in a same row.

On the other hand, bits forming the parity symbols are distributed and stored in the memory arrays 31_0 to 31_7. More specifically, four bits forming the parity symbol P0 are distributed and stored in the memory arrays 31_0 to 31_3, respectively, while four bits forming the parity symbol P1 are distributed and stored in the memory arrays 31_4 to 31_7, respectively. The parity cell 35 which stores bits of the parity symbols therein are located in a same row as the data cells 11 which store the information symbols belonging to the same block therein in each memory array 31 (in other words, simultaneously selected), but are arranged in the different memory areas 32A, 32B.

For example, although four data cells 11 which store the information symbol DQ0 at the column addresses Y0 to Y3 therein and the parity cells 35 which store bits corresponding to the column address Y0 of the parity symbol P0 are arranged in the same row of the memory array 31_0, the former cells are arranged in the memory area 32A and the latter cells are arranged in the memory area 32B. As a result, the reference cells 12A arranged in the memory area 32A are used to read data from the four data cells 11 which store the information symbol DQ0 therein, while the reference cells 12B arranged in the memory area 32B are used to read data from the parity cells 35 which store bits corresponding to the column address Y0 of the parity symbol P0.

Similarly, although the four data cell 11 which store the information symbol DQ0 at the column addresses Y4 to Y7 and the parity cells 35 which store bits corresponding to the column address Y4 of the parity symbol P0 are arranged to a same row of the memory array 31_0, the former cells are arranged in the memory area 32B and the latter cells are arranged in the memory area 32A. As a result, the reference cell 12A arranged in the memory area 32B are used to read data from the four data cells 11 which store the information symbol DQ0 therein, while the reference cell 12A arranged in the memory area 32A are used to read data from the parity cells 35 which store bits corresponding to the column address Y0 of the parity symbol P0.

According to such allocation, eight information symbols and eight bits of the parity symbols are read using different reference cells 12.

In the nonvolatile RAM in the present embodiment, even when an error is detected in the parity symbol, the error cannot be corrected. The reason is as follows: even when the data error is found in each bit of the parity symbol, it cannot be determined whether the data cell 11 or the reference cell 12 causes the data error. In the present embodiment, even when the error is detected in the parity symbol, the error in the data cell 11 or the reference cell 12 cannot be corrected.

However, the nonvolatile RAM in the present embodiment has a great advantage that the writing current passing to the memory array 31 at writing data can be made uniform. As understood from FIG. 14, when data at one address (for example, column address Y0) is rewritten, two memory cells rewritten in each memory array 31 are one data cell 11 located in the data region 33 and the parity cell 35 located in the parity region 34. Therefore, the writing current passing to the memory array 31 at writing data is uniform. This is effective to prevent a power voltage of the nonvolatile RAM from locally lowering and improve reliability of the write operation.

Summary of embodiments of the present invention will be described below.

In one embodiment of the present invention, a method of operating a semiconductor storage device for storing error correction codes, each of which is formed of a plurality of symbols, each of which is formed of a plurality of bits and which enables an error correction in units of symbols in memory arrays is provided. The plurality of bits are stored in memory cells including the phase change resistance element, the metal oxide resistance element or the solid electrolyte resistance element. According to the operating method, each symbol is read using the respective different reference cells. Furthermore, according to the operating method, in the case where a correctable error is detected in data read from the data cell forming the error correction code corresponding to the inputted address, (A) for a first error symbol as one-bit error pattern, data in the data cell corresponding to the error bit is corrected, and (B) for a second error symbol as multi-bit error pattern, data in the reference cell used to read the second error symbol is corrected.

After the data in the data cell of the first error symbol described in (A) is corrected, the re-read operation and the error detecting operation of the data cell forming the error correction code are performed and when correctable error is detected in the re-read data again, preferably, (C) data in the reference cell used to read the first error symbol is corrected.

Furthermore, according to the operating method, written data based on the error correction code is coded from inputted data, it is preferred that the writing data based on the error correction code is coded from the inputted data and error detecting result on read data in the data cell forming the error correction code corresponding to an inputted address.

Preferably, the plurality of symbols forming the error correction codes are classified into the plurality of information symbols and the plurality of parity symbols, reading is performed using the reference cell other than the reference cell used to read the data cell forming each information symbol, and the plurality of parity symbols are used to detect the data error of read data as the error correction code.

The plurality of information symbols and the plurality of parity symbols are stored in different memory arrays and it is preferred that the reference cell disposed in the same memory array is used to read the data cell forming each symbol.

Preferably, one information symbol of the plurality of information symbols, one parity symbol of the plurality of parity symbols, a first reference cell and a second reference cell are arranged in one memory array, the first reference cell is used to read the data cell forming the one information symbol and the second reference cell is used to read the data cell forming the one parity symbol.

The error correction codes are divided into a first code and a second code depending on the inputted address, a first information symbol and a first parity symbol in the first code, a second information symbol and a second parity symbol in the second code, the first reference cell and the second reference cell are arranged in one memory array. In the case where the first code is selected, the first reference cell is used to read the data cell of the first information symbol and the second reference cell is used to read the data cell of the first parity symbol, and in the case where the second code is selected, the second reference cell is used to read the data cell of the second information symbol and the first reference cell is used to read the data cell of the second parity symbol.

In another embodiment of the present invention, a method of operating a semiconductor storage device including a plurality of data cells for storing error correction codes, each of which is formed of a plurality of symbols, each of which is formed of a plurality of bits and which enables the error correction in units of symbols therein, a plurality of reference cell used for reading the data cells and a peripheral circuit including an ECC circuit is provided. Each of the plurality of data cells and the plurality of reference cells includes the phase change resistance element, the metal oxide resistance element or the solid electrolyte resistance element. According to the operating method, each symbol is read using the respective different reference cells. In the case where a correctable error is detected in data read from the data cell, the peripheral circuit performs a correcting operation of comparing bits of the read data and decoded data outputted from the ECC circuit with one another and writing correct data to the data cell with a different bit, that is, an error bit for the first error symbol as one-bit error pattern and a correcting operation of writing correct data to the reference cell used for reading the second error symbol for the second error symbol as multi-bit error pattern.

In the case where, after correcting the data cell with the error bit included in the first error symbol, the re-read operation and the error detecting operation of the data cell forming the error correction code are performed and the error bit is detected in a same symbol as the first error symbol of the re-read data again, it is preferred that the peripheral circuit performs a correcting operation of the reference cell used for reading the first error symbol.

In the case where the writing data based on the error correction code is coded from inputted data and the correctable error is detected in data read from the data cell forming the error correction code corresponding to the inputted address, it is preferred that the peripheral circuit of the ECC circuit performs an operation of comparing bits of the read data and the writing data to one another and correcting the data cell with a different bit for the symbol without error and the first error symbol as one-bit error pattern, and an operation of comparing bits of decoded data outputted from the ECC circuit and the writing data to one another and correcting the data cell with different bit for the second error symbol as multi-bit error pattern and an operation of correcting the reference cell used for reading the second error symbol.

Preferably, in the case where the re-read operation and the error detecting operation of the data cell forming the error correction code after the writing operation of the data cell of the first error symbol and the error bit is detected in a same symbol as the first error symbol in the re-read data, it is preferred that the peripheral circuit performs an operation of correcting the reference cell used for reading the first error symbol and an operation of correcting the data cell with one-bit error bit included in the first error symbol.

In still another embodiment of the present invention, a method of operating a semiconductor storage device including a plurality of data cells for storing first to $m^{th}$ block codes as error correction codes, each of which is formed of a plurality of symbols, each of which is formed of a plurality of bits and which enables the error correction in units of symbols therein, first to $n^{th}$ reference cells and peripheral circuits including first to $m^{th}$ ECC circuits is provided. Each of the plurality of data cells and the plurality of reference cells includes any one of the phase change resistance element, the metal oxide resistance element or the solid electrolyte resistance element. According to the operating method of the MRAM, in reading each of $i^{th}$ symbols of the first to $m^{th}$ block codes, data of the first to $m^{th}$ block codes is read while using an $i^{th}$ reference cell among the first to $n^{th}$ reference cells and an error detection for each of the first to $m^{th}$ block codes is performed by using the first to $m^{th}$ ECC circuits, respectively. In the case where correctable error is detected in each of the first to $m^{th}$ ECC circuits, when an error is detected in one $i^{th}$ symbol among m $i^{th}$ symbols read using the $i^{th}$ reference cell, the peripheral circuit corrects data in the data cell with the error bit, and when the error is detected in the plurality of $i^{th}$ symbols, the peripheral circuit corrects data in the $i^{th}$ reference cell.

An $j^{th}$ FCC circuit of the first to $m^{th}$ ECC circuits codes $j^{th}$ writing data based on the error correction code from inputted data, and preferably, in the case where each of the first to $m^{th}$ ECC circuits detects a correctable error, when an error is detected in one $i^{th}$ symbol of m $i^{th}$ symbols read using the $i^{th}$ reference cell, the peripheral circuit writes the $j^{th}$ writing data to the data cell of the $j^{th}$ block code, and when an error is detected in the plurality of $i^{th}$ symbols, the peripheral circuit writes the writing data to the data cell of the $j^{th}$ block code and corrects data in the $i^{th}$ reference cell.

Preferably, in the case where each of the first to $m^{th}$ ECC circuits detects a correctable error, when an error is detected in one $i^{th}$ symbol of m $i^{th}$ symbols read using the $i^{th}$ reference cell, in other words, an error symbol is detected in only the $i^{th}$ symbol in the $k^{th}$ block code among the first to $m^{th}$ block codes, the peripheral circuit performs of control to compare bits of read data of the $i^{th}$ symbol in the $k^{th}$ block code and $i^{th}$ symbol of decoded data outputted from the $k^{th}$ ECC circuit and correct the data cell with a different bit, that is, an error bit and when an error is detected in the plurality of $i^{th}$ symbols, the peripheral circuit corrects data in the $i^{th}$ reference cell.

The data cell of the $j^{th}$ block code of the first to $m^{th}$ block codes is a data cell selected with respect to the inputted address. Preferably, in the case where each of the first to $m^{th}$ ECC circuits detects a correctable error, when the error symbol is detected only the $i^{th}$ symbol of the $j^{th}$ block code among m $i^{th}$ symbols read using the $i^{th}$ reference cell, the peripheral circuit performs an operation of comparing bits of read data of the $i^{th}$ symbol in the $j^{th}$ block code and $i^{th}$ symbol of decoded data outputted from the $j^{th}$ ECC circuit and correcting the data cell with a different bit, that is, error bit, and when the error is detected in the plurality of $i^{th}$ symbols, the peripheral circuit corrects data in the $i^{th}$ reference cell and further outputs the decoded data outputted from the $j^{th}$ ECC circuit as read data at the address to the outside.

The $j^{th}$ ECC circuit of the first to $m^{th}$ ECC circuits codes $j^{th}$ writing data based on the error correction code from inputted data, and preferably, in the case where each of the first to $m^{th}$ ECC circuits detects a correctable error, when the error symbol is detected only the $i^{th}$ symbol of the $j^{th}$ block code among m $i^{th}$ symbols read using the $i^{th}$ reference cell, the peripheral circuit performs an operation of compares bits of read data of $i^{th}$ symbol in the $j^{th}$ block code and data of the $i^{th}$ symbol in the $j^{th}$ writing data with one another and correcting the data cell with a difference bit and when an error is detected in the plurality of $i^{th}$ symbols, the peripheral circuit performs control to correct data in the $i^{th}$ reference cell.

Although the present invention has been described referring to the embodiments, the present invention is not limited to the embodiments. A structure and details of the present invention can be variously modified within the scope of the present invention so as to be understood by those skilled in the art. For example, the error correcting coding method employed in the present invention is riot limited to the Reed-Solomon code. In place of the Reed-Solomon code, a burst error correction code in which one block includes a plurality of symbols can be adopted. Examples of such code include a fire code.

This application is the National Phase of PCT/JP2008/057285, filed Apr. 14, 2008, which claims priority based on Japanese Application No. 2007-108569 filed on Apr. 17, 2007 and disclosure thereof is entirely incorporated herein.

The invention claimed is:

1. An operation method of a semiconductor storage device which stores in a memory array, error correction codes, each of which comprises of symbols, each of which comprises bits, and which codes allow error correction in units of symbols,
   wherein said plurality of bits are stored in memory cells including any of phase change resistance elements, metal oxide resistance elements and solid electrolyte resistance elements,
   wherein the respective symbols are read by using different reference cells,
   wherein, when a correctable error is detected in read data from data cells forming said error correction codes and corresponding to an input address, (A) for a first error symbol of an one bit error pattern, a data in a data cell corresponding to the error bit is corrected, and (B) for a second error symbol related to a multi-bit error pattern, a data in a reference cell that is used to read the second error symbol is corrected,
   wherein after the data in the data cell associated with the first error symbol described in said (A) is corrected, a re-reading operation and an error detecting operation are performed for the data cells forming said error correction codes, and
   when a correctable error is detected again in the re-read data, (C) a data in a reference cell used to read said first error symbol is corrected.

2. The operation method according to claim 1, wherein, when a correctable error is detected again in the re-read data, the data in the reference cell described in said (A) is re-corrected.

3. The operation method according to claim 1, wherein said error correction codes are generated by coding input data, and said error correction codes are written into said data cells.

4. The operation method according to claim 1, wherein said error correction codes are generated by coding input data and an error detection result related to the read data from the data cells forming said error correction codes and the input address.

5. The operation method according to claim 1, wherein the plurality of symbols forming said error correction codes are classified into a plurality of information symbols and a plurality of parity symbols,
   wherein reading from a plurality of data cells forming the respective parity symbols are performed by using reference cells other than reference cells used for reading from data cells forming the respective information symbols, and
   wherein said plurality of parity symbols are used for detection of a data error of the read data of said error correction codes.

6. The operation method according to claim 5, wherein said plurality of information symbols and said plurality of parity symbols are stored in different memory arrays, respectively, and
- wherein reading from data cells forming respective symbols is performed by using reference cells placed in the same memory array as the respective data cells.

7. The operation method according to claim 5, wherein one information symbol of said plurality of information symbols, one parity symbol of said plurality of parity symbols, first and second reference cells are placed in one memory array,
- wherein the first reference cell is used for reading from data cells forming said one information symbol, and
- wherein the second reference cell is used for reading from data cells forming said one parity symbol.

8. The operation method according to claim 5, wherein said error correction codes are classified into any of first and second codes in response to the input address,
- wherein a first information symbol included in the first code, a first parity symbol included in the first code, a second information symbol included in the second code, a second parity symbol included in the second code, a first reference cell, and a second reference cell are placed in one memory array,
- wherein, when said first code is selected, the first reference cell is used for reading from data cells of said first information symbol, and the second reference cell is used for reading from data cells of said first parity symbol, and
- wherein, when said second code is selected, the second reference cell is used for reading from data cells of said second information symbol, and the second reference cell is used for reading from data cells of said second parity symbol.

9. An operation method of a semiconductor storage device including a plurality of data cells for storing error correction codes, each of which comprises of symbols, each of which comprises bits, and which codes allow error correction in units of symbols, a plurality of reference cells used for reading from said data cells, and a peripheral circuit comprising an ECC circuit,
- wherein each of said plurality of data cells and said plurality of reference cells includes any of a phase change resistance element, a metal oxide resistance element and a solid electrolyte resistance element,
- wherein the respective symbols are read by using different reference cells,
- wherein, when a correctable error is detected in read data from data cells, for a first error symbol of a one-bit error pattern, said peripheral circuit compares respective bits of the read data with corresponding bits of decoded data outputted by the ECC circuit and corrects a data cell corresponding to a non-matching bit, that is, an error bit, and for a second error symbol of a multi-bit error pattern, said peripheral circuit corrects a reference cell used for reading the second error symbol,
- wherein, after the data cell associated with the error bit included in the first error symbol is corrected, a re-reading operation and an error detecting operation are performed for the data cells forming said error correction codes, and
- wherein, when a correctable error is detected again in the same symbol as the first error symbol within the re-read data, said peripheral circuit performs an operation for correcting a reference cell used for reading of said first error symbol.

10. The operation method according to claim 9, wherein said ECC circuit performs coding of write data based on said error correction codes,
- wherein, when an correctable error is detected in the read data from the data cells forming said error correction codes and corresponding to the input address, for a symbol free of an error and a first error symbol of an one-bit error pattern, said peripheral circuit performs an operation for comparing respective bits of said read data with corresponding bits of said write data, and correcting a data cell corresponding to a non-matching bit, and for a second error symbol of a multi-bit error pattern, said peripheral circuit performs an operation for comparing respective bits of decoded data outputted from the ECC circuit with corresponding bits of said write data and correcting data cells corresponding to non-matching bits and an operation for correcting a reference cell used for reading of the second error symbol,
- wherein the operation for comparing respective bits of the read data with corresponding bits of the write data, and correcting data of the data cell corresponding to the non-matching bit are performed for both of a symbol free of an error and a first error symbol of a one-bit error pattern.

11. The operation method according to claim 10, wherein, after the data cell associated with the error bit included in the first error symbol is corrected, a re-reading operation and an error detecting operation are performed for the data cells forming said error correction codes, and
- wherein, when a correctable error is detected again in the same symbol as the first error symbol in the re-read data, said peripheral circuit performs an operation for correcting a reference cell used for reading of said first error symbol.

12. An operation method of a semiconductor storage device which comprises data cells which store first to m-th block codes as error correction codes which allow error correction in units of symbols, first to $n^{th}$ reference cells, and a peripheral circuit containing first to $m^{th}$ ECC circuits, each of the error correction codes comprising a plurality of symbols, each of which comprises a plurality of bits,
- wherein each of said plurality of data cells and said first to $n^{th}$ reference cells includes any of a phase change resistance element, a metal oxide resistance element and a solid electrolyte resistance element,
- wherein data of the first to $m^{th}$ block codes are read out, while using an $i^{th}$ reference cell of the first to $n^{th}$ reference cells, when an $i^{th}$ symbol of each of the first to $m^{th}$ block codes is read, and error detection is carried cut on each of the first to $m^{th}$ block codes by using the first to $m^{th}$ ECC circuits, respectively, and
- wherein, in a case where any of said first to $m^{th}$ ECC circuits detects a correctable error, for the m $i^{th}$ symbols read by using said $i^{th}$ reference cell, said peripheral circuit corrects a data in a data cell corresponding to an error bit when an error is detected in one of the $i^{th}$ symbols, and said peripheral circuit corrects a data said $i^{th}$ reference cell when errors are detected in two or more of the $i^{th}$ symbols,
- wherein, in the case where any of said first to $m^{th}$ ECC circuits detects the correctable error, for the m $i^{th}$ symbols read by using said $i^{th}$ reference cell, said peripheral circuit performs an operation of comparing respective bits of the $i^{th}$ symbol in a $k^{th}$ block code with corresponding bits of an $i^{th}$ symbol in decoded data outputted from the $k^{th}$ ECC circuit and corrects a data cell of a non-matching bit, that is, an error bit, when an error is detected in one of the $i^{th}$ symbols, that is, an error symbol is detected only for the $i^{th}$ symbol in the $k^{th}$ block code, and performs an operation of correcting data in the $i^{th}$ reference cell when errors are detected in two or more of the $i^{th}$ symbols.

13. The operation method according to claim 12, wherein a $j^{th}$ ECC circuit out of said first to $m^{th}$ ECC circuits performs coding of $i^{th}$ write data based on said error correction codes from input data,
 wherein, in the case where any of said first to $m^{th}$ ECC circuits detects the correctable error, for the m $i^{th}$ symbols read by using said $i^{th}$ reference cell, said peripheral circuit writes said $j^{th}$ write data in data cells of the $j^{th}$ block code when the error is detected in one of the $i^{th}$ symbols, and said peripheral circuit writes said write data into the data cells of the $j^{th}$ block code when errors are detected in two or more of the $i^{th}$ symbols,
 wherein the $j^{th}$ write data are written in data cells of the $j^{th}$ block code in both of the events in which an error is detected in one of the $i^{th}$ symbols and in which errors are detected in two or more of the $i^{th}$ symbols, and
 wherein data of the $i^{th}$ reference cell are corrected in the event that errors are detected in two or more of the $i^{th}$ symbols.

14. The operation method according to claim 12, wherein data cells of the $j^{th}$ block code out of said first to $m^{th}$ block codes are data cells selected for the input address, and
 wherein, in the case where any of said first to $m^{th}$ ECC circuits detects the correctable error, for the m $i^{th}$ symbols read by using said $i^{th}$ reference cell, said peripheral circuit performs an operation of comparing respective bits of read data of the $i^{th}$ symbol in the $j^{th}$ block code with corresponding bits of an $i^{th}$ symbol in decoded data outputted from the $j^{th}$ ECC circuit and corrects a data cell of a non-matching bit, that is, an error bit, when an error symbol is detected only for the $i^{th}$ symbol in said $j^{th}$ block code, and performs an operation of correcting data in the $i^{th}$ reference cell, outputting the decoded data outputted from the $j^{th}$ ECC circuit as read data of said address, when errors are detected in two or more of the $i^{th}$ symbols.

15. The operation method according to claim 14, wherein the $j^{th}$ ECC circuit out of the first to $m^{th}$ ECC circuits performs coding of the $j^{th}$ write data based on said error correction codes from the input data, and
 wherein, in the case where any of said first to $m^{th}$ ECC circuits detects the correctable error, for the m $i^{th}$ symbols read by using said $i^{th}$ reference cell, said peripheral circuit performs an operation of comparing respective bits of read data of the $i^{th}$ symbol in the $j^{th}$ block code with corresponding bits of an $i^{th}$ symbol in the said $j^{th}$ write data and corrects a data cell of a non-matching bit, when an error symbol is detected only for the $i^{th}$ symbol in said $j^{th}$ block code, and performs an operation of correcting data in the $i^{th}$ reference cell,
 wherein the operation of correcting data in the $i^{th}$ reference cell is performed when a correctable error is detected in which the error symbol is detected only for the $i^{th}$ symbol in the $j^{th}$ block code.

16. A semiconductor storage device which uses, for error detection and error correction, error correction codes each of which comprises of symbols, each of which comprises bits, and which codes allow error correction in units of symbols, comprising:
 a plurality of memory cells each including any of a phase change resistance element, a metal oxide resistance element and a solid electrolyte resistance element; and
 a peripheral circuit,
 wherein said plurality of memory cells include:
  data cells used for storing said plurality of symbols; and
  reference cells used for reading said plurality of symbols,
 wherein said peripheral circuit is configured to read said respective symbols by using different reference cells,
 wherein, when a correctable error is detected in read data from data cells forming said error correction codes and corresponding to an input address, (A) for a first error symbol of a one-bit error pattern, said peripheral circuit corrects data of a data cell corresponding to the error bit, and (B) for a second error symbol of a multi-bit error pattern, said peripheral circuit corrects data in a reference cell used for reading the second error symbol,
 wherein after the data in the data cell associated with the first error symbol described in said (A) is corrected, a re-reading operation and an error detecting operation are performed for the data cells forming said error correction codes, and
 when a correctable error is detected again in the re-read data, (C) a data in a reference cell used to read said first error symbol is corrected.

17. A semiconductor storage device which uses, for error detection and error correction, error correction codes each of which comprises of symbols, each of which comprises bits, and which codes allow error correction in units of symbols, comprising:
 a plurality of memory cells each including any of a phase change resistance element, a metal oxide resistance element and a solid electrolyte resistance element; and
 a peripheral circuit including an ECC circuit,
 wherein said plurality of memory cells include:
  data cells used for storing said plurality of symbols; and
  reference cells used for reading said plurality of symbols,
 wherein said peripheral circuit reads said respective symbols by using different reference cells, and
 wherein, when a correctable error is detected in read data from data cells, for a first error symbol of a one-bit error pattern, said peripheral circuit performs a control of comparing respective bits of the read data with corresponding bits of decoded data outputted by said ECC circuit and correcting a data cell corresponding to a non-matching bit, that is, an error bit, and for a second error symbol of a multi-bit error pattern, said peripheral circuit performs a control for correcting a reference cell used for reading the second error symbol,
 wherein, after the data cell associated with the error bit included in the first error symbol is corrected, a re-reading operation and an error detecting operation are performed for the data cells forming said error correction codes, and
 wherein, when a correctable error is detected again in the same symbol as the first error symbol within the re-read data, said peripheral circuit performs an operation for correcting a reference cell used for reading of said first error symbol.

18. A semiconductor storage device, comprising:
 a plurality of memory cells storing first to $m^{th}$ block codes which are error correction codes each of which comprises of a plurality of symbols, each of which comprises a plurality of bits, the error correction codes allowing error correction in units of symbols; first to $n^{th}$ reference cells; and a peripheral circuit including first to $m^{th}$ ECC circuits, wherein said peripheral circuit is configured to read said first to $m^{th}$ block codes while using an $i^{th}$ reference cell of the first to $n^{th}$ reference cells, when an $i^{th}$ symbol of each of the first to $m^{th}$ block codes is read, and to perform error detection on each of the first to $m^{th}$ block codes by using said first to $m^{th}$ ECC circuits, respectively, and wherein, in a case where any of said first to $m^{th}$ ECC circuits detects a correctable error, for the m $i^{th}$ symbols read by using said $i^{th}$ reference cell, said peripheral circuit corrects a data in a data cell corresponding to an error bit when an error is detected in one of the $i^{th}$ symbols, and said peripheral circuit corrects a data said $i^{th}$ reference cell when errors are detected in two or more of the $i^{th}$ symbols, wherein, in the case where any of said first to $m^{th}$ ECC circuits detects the correctable error, for the m $i^{th}$ symbols read by using said $i^{th}$ reference cell, said peripheral circuit performs an operation of comparing respective bits of the $i^{th}$ symbol in a $k^{th}$ block code with corresponding bits of am an $i^{th}$ symbol in decoded data outputted from the $k^{th}$ ECC circuit and corrects a data cell of a non-matching bit, that is, an error bit, when an error is detected in one of the $i^{th}$ symbols, that is, an error symbol is detected only for the $i^{th}$ symbol in the $k^{th}$ block code, and performs an operation of correcting data in the $i^{th}$ reference cell when errors are detected in two or more of the $i^{th}$ symbols.

* * * * *